United States Patent
Akutsu et al.

(10) Patent No.: US 9,163,162 B2
(45) Date of Patent: Oct. 20, 2015

(54) POLISHING AGENT, POLISHING AGENT SET AND METHOD FOR POLISHING BASE

(71) Applicant: HITACHI CHEMICAL COMPANY, LTD., Tokyo (JP)

(72) Inventors: Toshiaki Akutsu, Hitachi (JP); Hisataka Minami, Hitachi (JP); Tomohiro Iwano, Hitachi (JP); Koji Fujisaki, Kokubunji (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/424,970

(22) PCT Filed: Jul. 30, 2013

(86) PCT No.: PCT/JP2013/070619
§ 371 (c)(1),
(2) Date: Feb. 27, 2015

(87) PCT Pub. No.: WO2014/034358
PCT Pub. Date: Mar. 6, 2014

(65) Prior Publication Data
US 2015/0232704 A1    Aug. 20, 2015

(30) Foreign Application Priority Data

Aug. 30, 2012    (JP) .................................. 2012-190033

(51) Int. Cl.
*C09K 13/00*    (2006.01)
*C09G 1/02*    (2006.01)

(52) U.S. Cl.
CPC ....................................... *C09G 1/02* (2013.01)

(58) Field of Classification Search
CPC .......................................................... C09G 1/02
USPC ........................................................ 252/79.1
See application file for complete search history.

(56) References Cited

U.S. PATENT DOCUMENTS

2012/0315763 A1* 12/2012 Hanano et al. ................ 438/693

FOREIGN PATENT DOCUMENTS

| JP | 08-022970 A | 1/1996 |
|---|---|---|
| JP | 10-106994 A | 4/1998 |
| JP | 2006-249129 A | 9/2006 |
| JP | 2012-084906 A | 4/2012 |
| JP | 2013-038211 A | 2/2013 |
| WO | 02/067309 A1 | 8/2002 |
| WO | 2009/131133 A1 | 10/2009 |
| WO | 2010/067844 A1 | 6/2010 |

(Continued)

OTHER PUBLICATIONS

International Search Report for International Application No. PCT/JP2013/070619 dated Oct. 29, 2013.

(Continued)

*Primary Examiner* — Roberts Culbert
(74) *Attorney, Agent, or Firm* — Fitch, Even, Tabin & Flannery, LLP

(57) ABSTRACT

A polishing agent according to one embodiment of the present invention contains a liquid medium, an abrasive grain including a hydroxide of a tetravalent metal element, a polymer compound having an aromatic ring and a polyoxyalkylene chain, and a cationic polymer, wherein a weight average molecular weight of the polymer compound is 1000 or more.

8 Claims, 1 Drawing Sheet

(56) References Cited

FOREIGN PATENT DOCUMENTS

| WO | 2010/143579 A1 | 12/2010 |
| WO | 2011/081109 A1 | 7/2011 |
| WO | 2012/070541 A1 | 5/2012 |
| WO | 2012/070542 A1 | 5/2012 |
| WO | 2012/070544 A1 | 5/2012 |
| WO | 2013/124441 A1 | 8/2013 |
| WO | 2013/125446 A1 | 8/2013 |

OTHER PUBLICATIONS

International Search Report for International Application No. PCT/JP2014/061847 dated Jul. 15, 2014.

PCT Notification of Transmittal of Translation of the International Preliminary Report, dated Mar. 12, 2015, in International Application No. PCT/JP2013/070619.

* cited by examiner

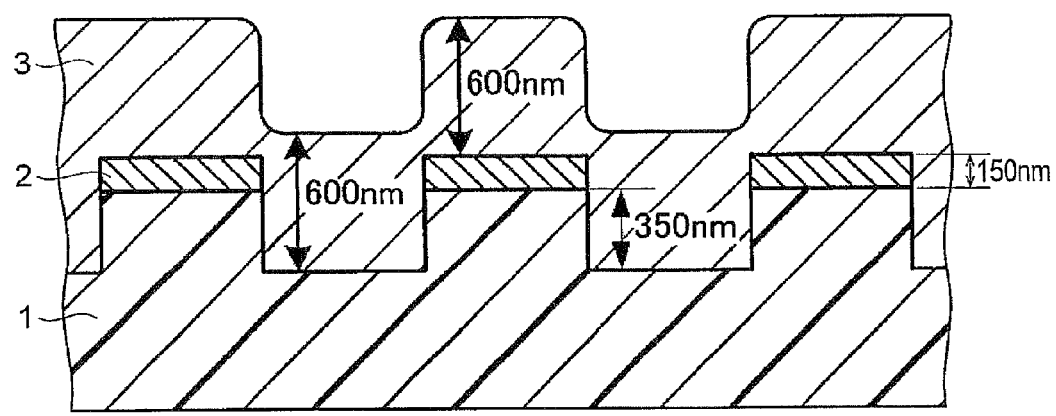

POLISHING AGENT, POLISHING AGENT SET AND METHOD FOR POLISHING BASE

TECHNICAL FIELD

The present invention relates to a polishing agent, a polishing agent set and a method for polishing a base. In particular, the present invention relates to a polishing agent, a polishing agent set and a method for polishing a base, for use in a flattening step of a base surface, which is a production technique of a semiconductor element. More specifically, the present invention relates to a polishing agent, a polishing agent set and a method for polishing a base, for use in a flattening step of a shallow trench isolation insulating material, a pre-metal insulating material, an interlayer insulating material, or the like.

BACKGROUND ART

In a recent production process of a semiconductor element, importance of a processing technique for high density and miniaturization has been increasingly higher. One processing technique, a CMP (Chemical Mechanical Polishing) technique, has been a technique essential for formation of shallow trench isolation (STI), flattening of a pre-metal insulating material or an interlayer insulating material, formation of a plug or an embedded metal wiring, or the like in the production process of a semiconductor element.

A polishing agent most frequently used is a silica type polishing agent containing a particle of silica (silicon oxide) such as fumed silica or colloidal silica as an abrasive grain. The silica type polishing agent is characterized by being high in general versatility, and the abrasive grain content, pH, additives or the like are appropriately selected to thereby enable polishing of broad types of materials including an insulating material and a conductive material.

On the other hand, the demand for a polishing agent containing a cerium compound particle as an abrasive grain, mainly directed to an insulating material such as silicon oxide, is also expanded. For example, a cerium oxide type polishing agent containing a cerium oxide (ceria) particle as an abrasive grain can polish silicon oxide at a higher rate even in a lower abrasive grain content rather than the silica type polishing agent (see, for example, Patent Literatures 1 and 2 below).

In recent years, there has been demanded for achieving further miniaturization of a wiring in the production process of a semiconductor element, and polishing scratches generated in polishing have been problematic. That is, even if fine polishing scratches are generated in polishing by use of a conventional cerium oxide type polishing agent, they have not been problematic as long as the sizes of these polishing scratches are smaller than a conventional wiring width, but it has been problematic in the case where further miniaturization of a wiring is to be achieved.

For solving this problem, a polishing agent has been studied in which a particle of a hydroxide of a tetravalent metal element is used (see, for example, Patent Literatures 3 to 5 below). In addition, a method for producing a particle of a hydroxide of a tetravalent metal element has also been studied (see, for example, Patent Literatures 6 and 7 below). These techniques are for decreasing as much as possible a mechanical action while using a chemical action possessed by the particle of a hydroxide of a tetravalent metal element, thereby reducing polishing scratches due to the particle.

In addition, in a CMP step or the like for formation of STI, performed is polishing of a laminate having a stopper (polishing stop layer containing a stopper material) disposed on the convex region of a substrate having a concavo-convex pattern, and an insulating material (for example, silicon oxide) disposed on the substrate and the stopper so that the concave region of the concavo-convex pattern is filled therewith. In such polishing, polishing of the insulating material is stopped by the stopper. That is, polishing of the insulating material is stopped when the stopper is exposed. The reason for this is because the amount of the insulating material polished (the amount of the insulating material removed) is difficult to artificially control, and thus the insulating material is polished until the stopper is exposed, thereby controlling the degree of polishing. In this case, the polishing selectivity of the insulating material to the stopper material (polishing rate ratio: polishing rate of insulating material/polishing rate of stopper material) is required to be increased. For this problem, Patent Literature 8 below discloses the following: a polishing agent contains a particle of a hydroxide of a tetravalent metal element, and at least one of a cationic polymer and polysaccharides to thereby allow silicon oxide to be polished at a high rate, and is excellent in polishing selecting ratio of the insulating material to silicon nitride. In addition, Patent Literature 9 below discloses the following: a polishing agent containing a particle of a hydroxide of a tetravalent metal element and a polyvinyl alcohol whose degree of saponification is 95 mol % or less is used to thereby obtain a high polishing rate ratio of the insulating material to polysilicon.

CITATION LIST

Patent Literatures

Patent Literature 1: Japanese Patent Application Laid-Open No. 10-106994
Patent Literature 2: Japanese Patent Application Laid-Open No. 08-022970
Patent Literature 3: International Publication No. WO 2002/067309
Patent Literature 4: International Publication No. WO 2012/070541
Patent Literature 5: International Publication No. WO 2012/070542
Patent Literature 6: Japanese Patent Application Laid-Open No. 2006-249129
Patent Literature 7: International Publication No. WO 2012/070544
Patent Literature 8: International Publication No. WO 2009/131133
Patent Literature 9: International Publication No. WO 2010/143579

SUMMARY OF INVENTION

Technical Problem

In recent years, in the CMP step or the like for formation of STI, it has been necessary to further increase the polishing selectivity of the insulating material to the stopper material for the purposes of enhancing flatness, suppressing erosion (over-polishing of the stopper material), and the like.

However, the present inventor has found that, with the polishing agents disclosed in Patent Literatures 8 and 9, while the polishing selectivity of the insulating material to the stopper material is increased on a blanket wafer with no patterns formed and in a region of a patterned wafer with a simulated pattern formed where the convex pattern density is high (region where a convex pattern is dense. For example, region having the convex pattern density of 50% or more), the stopper material may be excessively polished in a region of the patterned wafer where the convex pattern density is low (region where a convex pattern is coarse. For example, region having the convex pattern density of less than 50%), and there is room for improvement in the polishing selectivity of the insulating material to the stopper material.

In the CMP step or the like for formation of STI, in order to avoid the insulating material from remaining on the stopper after polishing is stopped at the stage where the insulating material such as silicon oxide is polished to allow the stopper to be exposed, polishing may be excessively performed even after the stopper is exposed. Such excessive polishing is called "over-polishing". For example, the continuance of polishing for a time having the same length as that of time A until the insulating material is polished to allow the stopper to be exposed (time corresponding to 100% of time A) is referred to as "100% of over-polishing".

If over-polishing is performed, however, a stopper material region exposed relatively earlier is polished for a longer time as compared with a stopper material region exposed relatively later, and may be thus excessively polished. In this case, the thickness of the stopper is locally different on the same patterned wafer to have an adverse effect on a device (semiconductor device and the like) finally obtained. Then, such a phenomenon is remarkably observed in the region of the patterned wafer, where the convex pattern density is low, and there is therefore demanded for suppressing the polishing rate of the stopper material without depending on the convex pattern density even in the case where over-polishing is performed.

The present invention is directed to solve these problems, and an object thereof is to provide a polishing agent, a polishing agent set and a method for polishing a base, which enable the polishing selectivity of the insulating material to the stopper material to be enhanced, and enable the polishing rate of the stopper material to be suppressed without depending on the convex pattern density even in the case where over-polishing is performed in polishing of the insulating material by use of the stopper.

Solution to Problem

In response, the present inventor has found that when a polymer compound having an aromatic ring and a polyoxyalkylene chain, and a cationic polymer are used in combination, the effect of further increasing the polishing selectivity of the insulating material to the stopper material as compared with a conventional case is exerted, and the polishing rate of the stopper material can be suppressed without depending on the convex pattern density even in the case where over-polishing is performed.

The polishing agent according to the present invention contains a liquid medium, an abrasive grain including a hydroxide of a tetravalent metal element, a polymer compound having an aromatic ring and a polyoxyalkylene chain, and a cationic polymer, wherein a weight average molecular weight of the polymer compound is 1000 or more.

The polishing agent according to the present invention enables the polishing selectivity of the insulating material to the stopper material to be enhanced. In addition, the polishing agent according to the present invention enables the polishing rate of the stopper material to be suppressed even in the case where over-polishing is performed in polishing of the insulating material in a region, where the convex pattern density is low, by use of the stopper. Therefore, even in the case where over-polishing is performed in polishing of the insulating material by use of the stopper, it is possible to suppress the polishing rate of the stopper material without depending on the convex pattern density. Accordingly, the polishing agent according to the present invention enables the polishing selectivity of the insulating material to the stopper material to be enhanced without depending on the convex pattern density even in the case where over-polishing is performed in polishing of the insulating material by use of the stopper.

While silicon nitride has been used as the stopper material for many years, polysilicon has been increasingly used as the stopper material in recent years in order to further enhance flatness in the CMP step or the like for formation of STI. In this case, from the viewpoint of increasing the polishing selectivity of the insulating material to polysilicon, it is necessary to suppress the polishing rate of polysilicon. A conventional polishing agent, however, has room for improvement in the polishing selectivity of the insulating material to polysilicon.

In response, the polishing agent according to the present invention enables the polishing selectivity of the insulating material to polysilicon to be enhanced. In addition, the polishing agent according to the present invention enables the polishing rate of polysilicon to be suppressed even in the case where over-polishing is performed in polishing of the insulating material in a region, where the convex pattern density is low, by use of polysilicon as the stopper material. Therefore, even in the case where over-polishing is performed in polishing of the insulating material by use of polysilicon as the stopper material, it is possible to suppress the polishing rate of polysilicon without depending on the convex pattern density. Accordingly, the polishing agent according to the present invention enables the polishing selectivity of the insulating material to polysilicon to be enhanced without depending on the convex pattern density even in the case where over-polishing is performed in polishing of the insulating material by use of polysilicon as the stopper material.

In addition, the polishing agent according to the present invention also enables to highly flatten, in a CMP technique for flattening a shallow trench isolation insulating material, a pre-metal insulating material, an interlayer insulating material, or the like, such an insulating material. The polishing agent according to the present invention also enables to polish the insulating material with decreased polishing scratches while highly flattening the insulating material.

It is preferable that the tetravalent metal element include at least one selected from the group consisting of a rare earth element and zirconium. This enables to suppress the occurrence of polishing scratches on a surface to be polished, while further enhancing the polishing selectivity of the insulating material to the stopper material without depending on the convex pattern density.

It is preferable that a content of the polymer compound be 0.01 mass % or more based on a total mass of the polishing agent. This enables to suppress the occurrence of polishing scratches on a surface to be polished, while further enhancing the polishing selectivity of the insulating material to the stopper material without depending on the convex pattern density.

It is preferable that the polymer compound include a compound represented by the following general formula (I):

$$R^{11}-O-(R^{12}-O)_{m1}-H \quad (I)$$

[wherein, in formula (I), $R^{11}$ represents an aryl group which may have a substituent, $R^{12}$ represents an alkylene group having 1 to 5 carbon atoms, which may have a substituent, and m1 represents an integer of 15 or more.]

One aspect of the present invention relates to use of the polishing agent in polishing of a surface to be polished including silicon oxide. That is, it is preferable that one aspect of the polishing agent according to the present invention be used in polishing of a surface to be polished including silicon oxide.

In the polishing agent set according to the present invention, constituents of the polishing agent are preserved with being separated to a first liquid and a second liquid, the first liquid contains the abrasive grain and a liquid medium, and the second liquid contains the polymer compound, the cationic polymer and a liquid medium. The polishing agent set according to the present invention enables the above effect, which is the same as the effect of the polishing agent according to the present invention, to be obtained.

The method for polishing a base according to the present invention may comprise a step of polishing a surface to be polished of a base by use of the polishing agent. In such a method for polishing a base, the above-mentioned polishing agent is used to thereby obtain the above effect which is the same as the effect of the polishing agent according to the present invention.

The method for polishing a base according to the present invention may comprise a step of polishing a surface to be polished of a base by use of a polishing agent obtained by mixing the first liquid and the second liquid of the polishing agent set. In such a method for polishing a base, the above-mentioned polishing agent set is used to thereby obtain the above effect which is the same as the effect of the polishing agent according to the present invention.

Advantageous Effects of Invention

According to the present invention, it is possible to provide a polishing agent, a polishing agent set and a method for polishing a base, which enable the polishing selectivity of the insulating material to the stopper material to be enhanced, and enable the polishing rate of the stopper material to be suppressed without depending on the convex pattern density even in the case where over-polishing is performed in polishing of the insulating material by use of the stopper.

In addition, according to the present invention, it is possible to provide a polishing agent, a polishing agent set and a method for polishing a base, which enable the polishing selectivity of the insulating material to polysilicon to be enhanced, and enable the polishing rate of polysilicon to be suppressed without depending on the convex pattern density even in the case where over-polishing is performed in polishing of the insulating material by use of polysilicon as the stopper material.

Furthermore, according to the present invention, in a CMP technique for flattening a shallow trench isolation insulating material, a pre-metal insulating material, an interlayer insulating material, or the like, it is also possible to polish the insulating material with decreased polishing scratches while enhancing the polishing selectivity of the insulating material to the stopper material without depending on the convex pattern density in polishing of the insulating material by use of the stopper.

BRIEF DESCRIPTION OF DRAWING

FIG. 1 is a schematic cross-sectional view illustrating a patterned wafer used in Examples.

DESCRIPTION OF EMBODIMENTS

Hereinafter, a polishing agent, a polishing agent set, and a method for polishing a base by use of them according to embodiments of the present invention are described in detail.

DEFINITION

In the present specification, the term "polishing agent" (abrasive) is defined as a composition to be brought into contact with a surface to be polished, at the time of polishing. The term "polishing agent" itself does not limit any components contained in the polishing agent. As described later, the polishing agent according to the present embodiment contains an abrasive grain (abrasive grain). While the abrasive grain is also referred to as "polishing particle" (abrasive particle), it is referred to as "abrasive grain" in the present specification. The abrasive grain is generally a solid particle. In this case, it is considered that a subject to be removed is removed (removed) by a mechanical action possessed by the abrasive grain and a chemical action possessed by the abrasive grain (mainly the surface of the abrasive grain) at the time of polishing, but the mechanism is not limited thereto.

<Polishing Agent>

The polishing agent according to the present embodiment is, for example, a polishing agent for CMP. Specifically, the polishing agent according to the present embodiment contains at least a liquid medium, an abrasive grain including a hydroxide of a tetravalent metal element, and additives, and contains at least, as the additives, a polymer compound having an aromatic ring and a polyoxyalkylene chain (hereinafter, referred to as "aromatic polyoxyalkylene compound"), and a cationic polymer. Hereinafter, an essential component, and a component which can be arbitrarily added are described.

(Abrasive Grain)

The abrasive grain of the polishing agent according to the present embodiment includes a hydroxide of a tetravalent metal element. The "hydroxide of a tetravalent metal element" is a compound including a tetravalent metal ($M^{4+}$) and at least one hydroxide ion ($OH^-$). The hydroxide of a tetravalent metal element may also include an anion (for example, a nitrate ion $NO_3^-$ and a sulfate ion $SO_4^{2-}$) other than the hydroxide ion. The hydroxide of a tetravalent metal element may also include, for example, an anion (for example, a nitrate ion and a sulfate ion) bound to the tetravalent metal element. The abrasive grain including the hydroxide of a tetravalent metal element can be higher in reactivity with an insulating material (for example, silicon oxide) to polish the insulating material at a higher polishing rate, as compared with a conventional abrasive grain made of silica, alumina, ceria or the like.

It is preferable that the tetravalent metal element include at least one selected from the group consisting of a rare earth element and zirconium. As the tetravalent metal element, a rare earth element is preferable from the viewpoint of further enhancing the polishing rate of the insulating material. Examples of the rare earth element which can be tetravalent include lanthanoids such as cerium, praseodymium and terbium, and among them, cerium is preferable from the viewpoint of being further excellent in polishing rate of the insulating material. A hydroxide of a rare earth element and a hydroxide of zirconium may also be used in combination, and two or more types of hydroxides of rare earth elements may be selected and used.

The hydroxide of a tetravalent metal element can be produced by reacting a salt of a tetravalent metal element with a basic compound (alkali source). For example, as the method for producing the hydroxide of a tetravalent metal element, a procedure can be used in which the salt of a tetravalent metal element is mixed with an alkali liquid. This method has been described in "Science of Rare Earth" [edited by Ginya ADACHI, Kagaku-Dojin Publishing Co., Inc., 1999] pp. 304 to 305.

As the salt of a tetravalent metal element, it is possible to use a conventionally known salt without particular limitation, examples include $M(SO_4)_2$, $M(NH_4)_2(NO_3)_6$, $M(NH_4)_4(SO_4)_4$ (M represents a rare earth element) and $Zr(SO_4)_2 \cdot 4H_2O$, and among them, $M(NH_4)_2(NO_3)_6$ is preferable. M is preferably cerium (Ce) which is chemically active.

As the alkali liquid, it is possible to use a conventionally known liquid without particular limitation. Examples of the basic compound in the alkali liquid include organic bases such as imidazole, tetramethylammonium hydroxide (TMAH), guanidine, triethylamine, pyridine, piperidine, pyrrolidone and chitosan; and inorganic bases such as ammonia, potassium hydroxide, sodium hydroxide and calcium hydroxide. Among them, from the viewpoint of further enhancing the polishing rate of the insulating material, ammonia and imidazole are preferable, and imidazole is more preferable. An abrasive grain including the hydroxide of a tetravalent metal element synthesized by the method can be washed for removal of metal impurities. In washing of the abrasive grain including the hydroxide of a tetravalent metal element, for example, a method can be used in which solid-liquid separation by centrifugation or the like is repeated several times. The washing can also be performed in a step of, for example, centrifugation, dialysis, ultrafiltration, or ion removal by an ion-exchange resin or the like.

In the case where the abrasive grain including the hydroxide of a tetravalent metal element, obtained above, aggregates, it is preferable to disperse in a liquid medium (for example, water) by an appropriate method. Examples of the method for dispersing the abrasive grain including the hydroxide of a tetravalent metal element in the liquid medium include a dispersing treatment by a usual stirrer; mechanical dispersing by a homogenizer, an ultrasonic disperser, a wet ball mill or the like; and removal of impurity ions by centrifugation, dialysis, ultrafiltration, an ion-exchange resin or the like. With respect to a dispersion method and a particle diameter control method, for example, methods described in Chapter 3 "Latest development trend and selection guidelines for various dispersers" in "Encyclopedia of Dispersion Technology" [Johokiko Co., Ltd., July 2005] can be used. Since the dispersibility of the abrasive grain including the hydroxide of a tetravalent metal element can also be increased by performing the above washing treatment to result in the reduction in electrical conductivity (for example, 500 mS/m or less) of a dispersion containing the abrasive grain including the hydroxide of a tetravalent metal element, the washing treatment may be applied as the dispersing treatment, or the washing treatment and the dispersing treatment may be used in combination.

Herein, the method for producing the abrasive grain as described above is described in detail in Patent Literature 7 above, and the description thereof is incorporated in the present invention.

In the polishing agent according to the present embodiment, the abrasive grain including the hydroxide of a tetravalent metal element and other abrasive grain may be used in combination. Examples of such other abrasive grain include silica, alumina, and ceria particles. As the abrasive grain including the hydroxide of a tetravalent metal element, it is also possible to use, for example, a composite particle including the hydroxide of a tetravalent metal element and silica.

The content of the hydroxide of a tetravalent metal element is preferably 80 mass % or more, more preferably 90 mass % or more, further preferably 95 mass % or more, particularly preferably 98 mass % or more, extremely preferably 99 mass % or more based on the whole of the abrasive grain. From the viewpoints that preparation of the polishing agent is easy and also polishing characteristics are further excellent, it is most preferable that the abrasive grain be made of the hydroxide of a tetravalent metal element (substantially 100 mass % of the abrasive grain is a particle of the hydroxide of a tetravalent metal element).

From the viewpoint of further enhancing the polishing rate of the insulating material, the abrasive grain including the hydroxide of a tetravalent metal element preferably produces an absorbance of 1.00 or more for light with a wavelength of 400 nm in an aqueous dispersion in which the content of the abrasive grain is adjusted to 1.0 mass %. Herein, the "aqueous dispersion" in which the content of the abrasive grain is adjusted to a predetermined amount means a liquid containing a predetermined amount of the abrasive grain and water. The reason why the enhancement effect of the polishing rate is obtained is not necessarily clear, but it is considered by the present inventor as follows. That is, it is considered that a particle including $M(OH)_a X_b$ (wherein $a+b \times c=4$) made of a tetravalent metal ($M^{4+}$), 1 to 3 hydroxide ions ($OH^-$) and 1 to 3 anions ($X^{c-}$) is generated as a part of the abrasive grain (herein, such a particle is also the "abrasive grain including the hydroxide of a tetravalent metal element") depending on production conditions of the hydroxide of a tetravalent metal element and the like. It is considered that, in $M(OH)_a X_b$, an electron-withdrawing anion ($X^{c-}$) acts to enhance reactivity of the hydroxide ion and the polishing rate is enhanced with the increase in amount of $M(OH)_a X_b$ present. Then, it is considered that the particle including $M(OH)_a X_b$ absorbs light with a wavelength of 400 nm and thus the polishing rate is enhanced as the amount of $M(OH)_a X_b$ present is increased and the absorbance for light with a wavelength of 400 nm is higher.

The abrasive grain including the hydroxide of a tetravalent metal element can include not only $M(OH)_a X_b$ but also $M(OH)_4$, $MO_2$, and the like. Examples of the anion ($X^{c-}$) include $NO_3^-$ and $SO_4^{2-}$.

Herein, inclusion of $M(OH)_a X_b$ in the abrasive grain can be confirmed by a method in which the abrasive grain is well washed with pure water and thereafter the peak corresponding to the anion ($X^{c-}$) is detected by the FT-IR ATR method (Fourier transform Infra Red Spectrometer Attenuated Total Reflection Method). The presence of the anion ($X^{c-}$) can also be confirmed by the XPS method (X-ray Photoelectron Spectroscopy).

From the viewpoint of further enhancing the polishing rate of the insulating material, the abrasive grain preferably produces an absorbance of 1.000 or more for light with a wavelength of 290 nm in an aqueous dispersion in which the content of the abrasive grain is adjusted to 0.0065 mass %. The reason why such an enhancement effect of the polishing rate is obtained is not necessarily clear, but it is considered by the present inventor as follows. That is, a particle including $M(OH)_a X_b$ generated depending on production conditions of the hydroxide of a tetravalent metal element and the like has an absorption peak around a wavelength of 290 nm in calculation, and for example, a particle of $Ce^{4+}(OH^-)_3 NO_3^-$ has an absorption peak at a wavelength of 290 nm. Therefore, it is considered that the polishing rate is enhanced as the amount of $M(OH)_a X_b$ present is increased and the absorbance for light with a wavelength of 290 nm is higher.

The hydroxide of a tetravalent metal element (for example, $M(OH)_a X_b$) tends not to absorb light with a wavelength of 450 nm or more, particularly light with a wavelength of 450 to 600 nm. Accordingly, from the viewpoint of suppressing the occurrence of an adverse effect on polishing due to inclusion of impurities to polish the insulating material at a more excellent polishing rate, it is preferable that the abrasive grain produces an absorbance of 0.010 or less for light with a wavelength of 450 to 600 nm in an aqueous dispersion in which the content of the abrasive grain is adjusted to 0.0065 mass %.

From the viewpoint of further enhancing the polishing rate of the insulating material, it is preferable that the abrasive grain produces a light transmittance of 50%/cm or more for light with a wavelength of 500 nm in an aqueous dispersion in which the content of the abrasive grain is adjusted to 1.0 mass %. The reason why such an enhancement effect of the polishing rate is obtained is not necessarily clear, but it is considered by the present inventor as follows. That is, it is considered that, with respect to the action as the abrasive grain possessed by the abrasive grain including the hydroxide of a tetravalent metal element, a chemical action is more dominant than a mechanical action. Therefore, it is considered that the number of abrasive grains more contributes to the polishing rate than the size of the abrasive grain.

It is considered that, in the case where the light transmittance is low in the aqueous dispersion in which the content of the abrasive grain is adjusted to 1.0 mass %, a particle having a large particle diameter (hereinafter, referred to as "coarse particle") is present in a relatively larger number in the abrasive grain present in the aqueous dispersion. When an additive is added to a polishing agent including such an abrasive grain, other particles aggregate with the coarse particle as a nucleus. As a result, it is considered that the number of abrasive grains (effective number of abrasive grains) acting on the surface to be polished, per unit area, is reduced and the specific surface area of the abrasive grain in contact with the surface to be polished is reduced, and thus the polishing rate may be lowered.

On the other hand, it is considered that, in the case where the light transmittance is high in the aqueous dispersion in which the content of the abrasive grain is adjusted to 1.0 mass %, the abrasive grain present in the aqueous dispersion is in the state where the "coarse particle" is present in a small amount. In the case where the amount of the coarse particle present is small in this way, the coarse particle serving as a nucleus of aggregation is present in a small amount even if an additive is added to the polishing agent, and thus aggregation of the abrasive grain is suppressed or the size of an aggregation particle is smaller. As a result, it is considered that the number of abrasive grains (effective number of abrasive grains) acting on the surface to be polished, per unit area, is maintained and the specific surface area of the abrasive grain in contact with the surface to be polished is maintained, and thus the polishing rate is hardly lowered and the polishing rate of the insulating material is easily enhanced.

The absorbance and the light transmittance produced by the abrasive grain contained in the polishing agent in the aqueous dispersion of the abrasive grain can be measured using, for example, a spectrophotometer (apparatus name: U3310) manufactured by Hitachi Ltd. Specifically, for example, an aqueous dispersion in which the content of the abrasive grain is adjusted to 1.0 mass % or 0.0065 mass % is prepared as a measurement sample. About 4 mL of this measurement sample is placed in a cell of 1 cm square, and the cell is set up in the apparatus. Then, the absorbance is measured in the wavelength range from 200 to 600 nm, and the absorbance and the light transmittance are determined from the resulting chart.

The absorbance and the light transmittance produced by the abrasive grain contained in the polishing agent in the aqueous dispersion of the abrasive grain can be measured by removing a solid component other than the abrasive grain and a liquid component other than water, then preparing an aqueous dispersion having a predetermined abrasive grain content, and using the aqueous dispersion. Although being different depending on components contained in the polishing agent, a method that can be used for removal of the solid component and the liquid component is a centrifugation method such as centrifugation using a centrifuge which can apply an acceleration of gravity of several thousands of G or less, or ultracentrifugation using an ultracentrifuge which can apply an acceleration of gravity of several tens of thousands of G or more; a chromatography method such as partition chromatography, adsorption chromatography, gel permeation chromatography or ion-exchange chromatography; a filtration method such as natural filtration, filtration under reduced pressure, pressure filtration or ultrafiltration; or a distillation method such as distillation under reduced pressure or atmospheric distillation, and these may be appropriately combined.

For example, in the case where a compound having a weight average molecular weight of several tens of thousands or more (for example, 50000 or more) is contained, examples include a chromatography method and a filtration method, and gel permeation chromatography and ultrafiltration are preferable. In the case where a filtration method is used, the abrasive grain contained in the polishing agent can be allowed to pass through a filter under conditions appropriately set. In the case where a compound having a weight average molecular weight of several tens of thousands or less (for example, less than 50000) is contained, examples include a chromatography method, a filtration method, and a distillation method, and gel permeation chromatography, ultrafiltration, and distillation under reduced pressure are preferable. In the case where different types of abrasive grains are contained, examples include a filtration method and a centrifugation method; and in the case of a filtration method, the abrasive grain including the hydroxide of a tetravalent metal element is contained in a filtrate in a larger amount, and in the case of a centrifugation method, the abrasive grain is contained in a liquid phase in a larger amount.

In the method for separating the abrasive grain by the chromatography method, for example, the abrasive grain and/or other components can be fractionated according to the following conditions.

Specimen solution: polishing agent, 100 μL

Detector: UV-VIS detector, trade name "L-4200" manufactured by Hitachi Ltd., wavelength: 400 nm Integrator: GPC integrator, trade name "D-2500" manufactured by Hitachi Ltd.

Pump: trade name "L-7100" manufactured by Hitachi Ltd.

Column: packing column for aqueous HPLC, trade name "GL-W550S" manufactured by Hitachi Chemical Co., Ltd.

Eluent: deionized water

Measurement temperature: 23° C.

Flow rate: 1 mL/min (pressure: about 40 to 50 kg/cm$^2$)

Measurement time: 60 minutes

Herein, it is preferable that a degassing treatment of the eluent be performed using a degasifier before chromatography is performed. In the case where a degasifier cannot be used, it is preferable that the eluent be subjected to a degassing treatment with ultrasonic or the like in advance.

The abrasive grain cannot be possibly fractionated under the above conditions depending on the components contained in the polishing agent. In this case, separation is possible by optimizing the amount of the specimen solution, the type of the column, the type of the eluent, the measurement temperature, the flow rate, and the like. In addition, separation from the abrasive grain can be possibly achieved by adjusting the pH of the polishing agent to thereby adjust the elution times of the components contained in the polishing agent. In the case where any insoluble component is present in the polishing agent, it is preferable that the insoluble component be removed by filtration, centrifugation, or the like as necessary.

The lower limit of the average particle diameter of the abrasive grain in the polishing agent is preferably 1 nm or more, more preferably 2 nm or more, further preferably 5 nm or more, from the viewpoint of obtaining a further suitable polishing rate to the insulating material. The upper limit of the average particle diameter of the abrasive grain is preferably 300 nm or less, more preferably 250 nm or less, further preferably 200 nm or less, from the viewpoint of further inhibiting the surface to be polished from being scratched. From the above viewpoints, it is more preferable that the average particle diameter of the abrasive grain be 1 nm or more and 300 nm or less.

The "average particle diameter" of the abrasive grain means the average secondary particle diameter of the abrasive grain in the polishing agent. In measurement of the average particle diameter of the abrasive grain, for example, a light diffraction scattering particle size distribution meter (for example, trade name: N5 manufactured by Beckman Coulter, or trade name: Zetasizer 3000HSA manufactured by Malvern Instruments Ltd.) can be used.

The lower limit of the content of the abrasive grain is preferably 0.005 mass % or more, more preferably 0.01 mass % or more, further preferably 0.02 mass % or more, particularly preferably 0.04 mass % or more based on the total mass of the polishing agent, from the viewpoint of further enhancing the polishing rate of the insulating material. The upper limit of the content of the abrasive grain is preferably 20 mass % or less, more preferably 15 mass % or less, further preferably 10 mass % or less based on the total mass of the polishing agent, from the viewpoint of increasing the storage stability of the polishing agent. From the above viewpoints, it is more preferable that the content of the abrasive grain be 0.005 mass % or more and 20 mass % or less based on the total mass of the polishing agent.

In addition, it is preferable that the content of the abrasive grain be further reduced from the viewpoint that the cost and polishing scratches can be further reduced. Conventionally, there has been the following tendency: when the content of the abrasive grain is reduced, the polishing rate of the insulating material or the like is reduced. On the other hand, the abrasive grain including the hydroxide of a tetravalent metal element can obtain a predetermined polishing rate even in a smaller amount, and thus the content of the abrasive grain can be further reduced while the polishing rate and the advantage of the reduction in content of the abrasive grain are balanced. From such a viewpoint, the content of the abrasive grain is preferably 5 mass % or less, more preferably 3 mass % or less, further preferably 1 mass % or less, particularly preferably 0.5 mass % or less, extremely preferably 0.3 mass % or less.

(Additives)

The polishing agent according to the present embodiment contains additives. The "additives" here refer to substances other than the liquid medium and the abrasive grain, contained in the polishing agent, in order to adjust polishing characteristics such as polishing rate and polishing selectivity; and characteristics of the polishing agent such as dispersibility of the abrasive grain and storage stability.

[First Additive: Aromatic Polyoxyalkylene Compound]

The polishing agent according to the present embodiment contains an aromatic polyoxyalkylene compound (polymer compound having an aromatic ring and a polyoxyalkylene chain) as a first additive. The aromatic polyoxyalkylene compound is a compound in which a substituent having an aromatic ring is introduced to the terminal of a polyoxyalkylene chain. The aromatic ring may be directly bound or not be directly bound to the polyoxyalkylene chain. The aromatic ring may be a monocyclic or polycyclic. The aromatic polyoxyalkylene compound may have a structure in which a plurality of polyoxyalkylene chains is bonded via a substituent having an aromatic ring. The polyoxyalkylene chain is preferably a polyoxyethylene chain or a polyoxypropylene chain. The number of structure units in the polyoxyalkylene chain is preferably 15 or more.

The aromatic polyoxyalkylene compound has the effect of inhibiting the polishing rate of the stopper material from being excessively increased. In addition, the aromatic polyoxyalkylene compound can be used to thereby enhance the polishing selectivity of the insulating material to the stopper material without depending on the convex pattern density. The reason why such effects are exerted is presumed as follows: the aromatic polyoxyalkylene compound covers the stopper material to thereby suppress polishing of the stopper material. Thus, it is presumed that, even in the case of polishing a region having a low convex pattern density, progress of polishing of the stopper material by the abrasive grain is alleviated and the density dependence regarding coarseness/fineness of the convex pattern density is reduced. The respective effects above are more remarkably achieved in the case where the stopper material is polysilicon.

Examples of the substituent having an aromatic ring include an aryl group, in the case where the aromatic ring is positioned at the terminal of the aromatic polyoxyalkylene compound. Examples of the aryl group include monocyclic aromatic groups such as a phenyl group, a benzyl group, a tolyl group and a xylyl group; and polycyclic aromatics such as a naphthyl group, and such aromatic groups may further have a substituent. Examples of the substituent introduced to the aromatic group include an alkyl group, a vinyl group, an allyl group, an alkenyl group, an alkynyl group, an alkoxy group, a halogeno group, a hydroxy group, a carbonyl group, a nitro group, an amino group, a styrene group and an aromatic group, and an alkyl group and a styrene group are preferable.

Examples of the substituent having an aromatic ring include an arylene group, in the case where the aromatic ring is positioned in the main chain of the aromatic polyoxyalkylene compound. Examples of the arylene group include monocyclic aromatic groups such as a phenylene group, a tolylene group and a xylylene group; and polycyclic aromatics such as a naphthylene group, and such aromatic groups may further have a substituent. Examples of the substituent introduced to the aromatic group include an alkyl group, a vinyl group, an allyl group, an alkenyl group, an alkynyl group, an alkoxy group, a halogeno group, a hydroxy group, a carbonyl group, a nitro group, an amino group, a styrene group and an aromatic group.

Examples of the aromatic polyoxyalkylene compound include a compound represented by the following general formula (I) and a compound represented by the following general formula (II).

[wherein, in formula (I), $R^{11}$ represents an aryl group which may have a substituent, $R^{12}$ represents an alkylene group having 1 to 5 carbon atoms, which may have a substituent, and m1 represents an integer of 15 or more.]

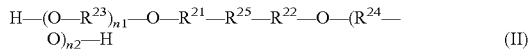

(II)

[wherein, in formula (II), $R^{21}$ and $R^{22}$ each independently represent an arylene group which may have a substituent, $R^{23}$, $R^{24}$ and $R^{25}$ each independently represent an alkylene group having 1 to 5 carbon atoms, which may have a substituent, and n1 and n2 each independently represent an integer of 15 or more.]

From the viewpoint of further enhancing the polishing selectivity of the insulating material to the stopper material, it is preferable that the formula (I) or formula (II) satisfy at least one of the following conditions.

$R^{11}$ is preferably aryl group above exemplified as the substituent having an aromatic ring, more preferably a phenyl group to which an alkyl group or a styrene group is introduced as a substituent.

$R^{21}$ and $R^{22}$ are preferably arylene group above exemplified as the substituent having an aromatic ring.

$R^{12}$, $R^{23}$, $R^{24}$ and $R^{25}$ are preferably an ethylene group or a n-propylene group.

m1 is preferably 15 or more, more preferably 30 or more, further preferably 45 or more, particularly preferably 60 or more.

m1 is preferably 2000 or less, more preferably 900 or less, further preferably 600 or less, particularly preferably 300 or less.

n1 and n2 are preferably 15 or more, more preferably 30 or more.

n1 and n2 are preferably 2000 or less, more preferably 900 or less, further preferably 600 or less, particularly preferably 300 or less.

Among them, from the viewpoint of further enhancing the polishing selectivity of the insulating material to the stopper material, the compound represented by the formula (I) is preferable. From the same viewpoint, among the compound represented by the formula (I), a compound represented by the following general formula (III) and a compound represented by the following general formula (IV) are more preferable, and a compound represented by the following general formula (III) is further preferable.

[Chemical Formula 1]

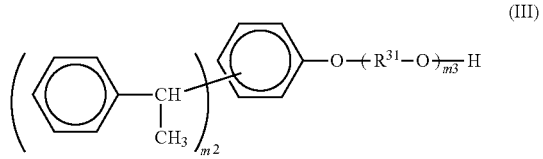

(III)

[wherein, in formula (III), $R^{31}$ represents an alkylene group having 1 to 5 carbon atoms, which may have a substituent, m2 represents an integer of 1 to 3, and m3 represents an integer of 15 or more.]

[Chemical Formula 2]

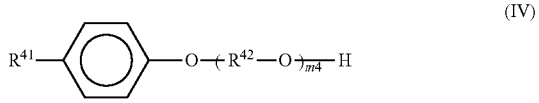

(IV)

[wherein, in formula (IV), $R^{41}$ represents an alkyl group which may have a substituent, $R^{42}$ represents an alkylene group having 1 to 5 carbon atoms, which may have a substituent, and m4 represents an integer of 15 or more. In addition, the aromatic ring in the formula (IV) may further have a substituent.]

From the viewpoint of further enhancing the polishing selectivity of the insulating material to the stopper material, it is preferable that the formula (III) or formula (IV) satisfy at least one of the following conditions.

$R^{31}$ is preferably an ethylene group or a n-propylene group, more preferably an ethylene group.

$R^{41}$ is preferably an alkyl group having 1 to 40 carbon atoms, more preferably an alkyl group having 6 to 20 carbon atoms.

$R^{42}$ is preferably an ethylene group or a n-propylene group, more preferably an ethylene group.

m2 is preferably 1 or more.

m3 is preferably 15 or more, more preferably 30 or more, further preferably 45 or more, particularly preferably 60 or more.

m3 is preferably 2000 or less, more preferably 900 or less, further preferably 600 or less, particularly preferably 300 or less.

m4 is preferably 15 or more, more preferably 30 or more, further preferably 45 or more, particularly preferably 60 or more.

m4 is preferably 2000 or less, more preferably 900 or less, further preferably 600 or less, particularly preferably 300 or less.

An additional substituent other than $R^{41}$ in the aromatic ring of the formula (IV) is preferably a propenyl group.

Examples of the aromatic polyoxyalkylene compound represented by the formula (I) include polyoxyethylene phenyl ether, polyoxypropylene phenyl ether, polyoxyethylene cumyl phenyl ether and polyoxyethylene benzyl ether; aromatic polyoxyalkylene compounds represented by the above formula (III), such as polyoxyethylene styrenated phenyl ethers (for example, Emulgen A-500 produced by Kao Corporation; and Noigen EA-7 series produced by Dai-Ichi Kogyo Seiyaku Co., Ltd.); and aromatic polyoxyalkylene compounds represented by the formula (IV), such as polyoxyethylene alkylphenyl ethers (for example, Emulsit series produced by Dai-Ichi Kogyo Seiyaku Co., Ltd.), and polyoxyethylene nonylpropenylphenyl ethers (for example, Aqualon RN series produced by Dai-Ichi Kogyo Seiyaku Co., Ltd.).

Examples of the aromatic polyoxyalkylene compound represented by the formula (II) include 2,2-bis(4-polyoxyethylene oxyphenyl)propane.

In the polishing agent according to the present embodiment, the aromatic polyoxyalkylene compound can be used singly or in combination of two or more for the purpose of adjusting polishing characteristics such as polishing selectivity and flatness.

The lower limit of the weight average molecular weight of the aromatic polyoxyalkylene compound is 1000 or more, preferably 1500 or more, more preferably 2000 or more, further preferably 3000 or more, from the viewpoint that the polishing selectivity of the insulating material to the stopper material is excellent. The upper limit of the weight average molecular weight of the aromatic polyoxyalkylene compound is preferably 100000 or less, more preferably 50000 or less, further preferably 30000 or less, particularly preferably 20000 or less, extremely preferably 15000 or less, very preferably 10000 or less, from the viewpoint that the polishing selectivity of the insulating material to the stopper material is further excellent.

Herein, the weight average molecular weight of the aromatic polyoxyalkylene compound can be measured, for example, using the calibration curve of standard polystyrene according to the gel permeation chromatography method (GPC) under the following conditions.

Instrument used: Hitachi L-6000 Model [manufactured by Hitachi Ltd.]

Column: Gel-Pak GL-R420+Gel-Pak GL-R430+Gel-Pak GL-R440 [manufactured by Hitachi Chemical Co., Ltd., trade names, three columns in total]

Eluent: tetrahydrofuran

Measurement temperature: 40° C.

Flow rate: 1.75 mL/min

Detector: L-3300RI [manufactured by Hitachi Ltd.]

It is preferable that the lower limit of the content of the aromatic polyoxyalkylene compound be 0.01 mass % or more based on the total mass of the polishing agent. Thus, it is possible to further inhibit polishing scratches from being generated on the surface to be polished while enhancing the polishing selectivity of the insulating material to the stopper material without depending on the convex pattern density. From the same viewpoint, the lower limit of the content of the aromatic polyoxyalkylene compound is more preferably 0.05 mass % or more, further preferably 0.1 mass % or more, particularly preferably 0.2 mass % or more based on the total mass of the polishing agent. The upper limit of the content of the aromatic polyoxyalkylene compound is not particularly limited, but is preferably 10.0 mass % or less, more preferably 5.0 mass % or less, further preferably 3.0 mass % or less, particularly preferably 2.0 mass % or less, extremely preferably 1.0 mass % or less based on the total mass of the polishing agent, from the viewpoint that stability and productivity are excellent. In the case where a plurality of compounds is used for the aromatic polyoxyalkylene compound, it is preferable that the total of the contents of the respective compounds satisfy the above range.

[Second Additive: Cationic Polymer]

The polishing agent according to the present embodiment contains a cationic polymer as a second additive, other than the first additive (aromatic polyoxyalkylene compound) above. The "cationic polymer" is defined as a polymer having a cation group or a group which can be ionized to a cation group in the main chain or a side chain. Examples of the cation group include an amino group, an imino group and a cyano group.

The cationic polymer is used in combination with the aromatic polyoxyalkylene compound to thereby exert the effect of further inhibiting the polishing rate of the stopper material (for example, polysilicon) from being excessively increased. Also, the cationic polymer can inhibit reduction in the polishing rate of the insulating material caused by the excessive covering of the insulating material (for example, silicon oxide) in addition to the stopper material with the aromatic polyoxyalkylene compound. In addition, there is also exerted the effect of enhancing the polishing rate of the insulating material. Therefore, in the case where the aromatic polyoxyalkylene compound and the cationic polymer are used in combination, it is considered that the cationic polymer can interact with the aromatic polyoxyalkylene compound to thereby not only suppress the polishing rate of the stopper material but also enhance the polishing rate of the insulating material.

Examples of the cationic polymer include polymers (an allylamine polymer, a diallylamine polymer, a vinylamine polymer and an ethyleneimine polymer) obtained by polymerizing at least one monomer component selected from the group consisting of allylamine, diallylamine, vinylamine, ethyleneimine and derivatives thereof, and polysaccharides such as chitosan and chitosan derivatives.

The allylamine polymer is a polymer obtained by polymerizing allylamine or a derivative thereof. Examples of the allylamine derivative include alkoxycarbonylated allylamines, methylcarbonylated allylamines, aminocarbonylated allylamines and ureated allylamines.

The diallylamine polymer is a polymer obtained by polymerizing diallylamine or a derivative thereof. Examples of the diallylamine derivative include methyldiallylamines, a diallyldimethylammonium salt, a diallylmethylethylammonium salt, acylated diallylamines, aminocarbonylated diallylamines, alkoxycarbonylated diallylamines, aminothiocarbonylated diallylamines and hydroxyalkylated diallylamines. Examples of the ammonium salt include ammonium chloride and ammonium alkyl sulfate (for example, ammonium ethyl sulfate). The diallylamine polymer is preferably a diallyldimethylammonium chloride polymer from the viewpoint of further enhancing the polishing selectivity of the insulating material to the stopper material.

The vinylamine polymer is a polymer obtained by polymerizing vinylamine or a derivative thereof. Examples of the vinylamine derivative include alkylated vinylamines, amidated vinylamines, ethylene oxidized vinylamines, propylene oxidized vinylamines, alkoxylated vinylamines, carboxymethylated vinylamines, acylated vinylamines and ureated vinylamines.

The ethyleneimine polymer is a polymer obtained by polymerizing ethyleneimine or a derivative thereof. Examples of the ethyleneimine derivative include an aminoethylated acrylic polymer, alkylated ethyleneimines, ureated ethyleneimines and propylene oxidized ethyleneimines.

The cationic polymer may have a structure unit derived from a monomer component other than allylamine, diallylamine, vinylamine, ethyleneimine and derivatives thereof, and may have, for example, a structure unit derived from acrylamide, dimethylacrylamide, diethylacrylamide, hydroxyethylacrylamide, acrylic acid, methyl acrylate, methacrylic acid, maleic acid, sulfur dioxide or the like.

The cationic polymer may be a homopolymer of allylamine, diallylamine, vinylamine or ethyleneimine (polyallylamine, polydiallylamine, polyvinylamine or polyethyleneimine), and is preferably a homopolymer of allylamine (polyallylamine) from the viewpoint of further enhancing the polishing selectivity of the insulating material to the stopper material.

The cationic polymer may be a copolymer having a structure unit derived from allylamine, diallylamine, vinylamine, ethyleneimine or a derivative thereof. In the copolymer, the arrangement of the structure unit is arbitrary. For example, any form such as (a) a block copolymerization form in which the same type structure units are respectively continued, (b) a random copolymerization form in which a structure unit A and a structure unit B are arranged without being ordered, or (c) an alternating copolymerization in which a structure unit A and a structure unit B are alternately arranged can be adopted.

The copolymer is preferably a copolymer obtained by polymerizing a composition containing acrylamide as a monomer component, more preferably a copolymer obtained by polymerizing a composition containing a diallyldimethylammonium salt and acrylamide as monomer components, further preferably a diallyldimethylammonium chloride-acrylamide copolymer, from the viewpoint of further enhancing the polishing selectivity of the insulating material to the stopper material.

Examples of the chitosan derivative include chitosan pyrrolidone carboxylate, cationated chitosans, hydroxypropyl chitosan, chitosan lactate, glycerylated chitosans, glycol chitosan, carboxymethyl chitosan (CM-chitosan) and carboxymethyl chitosan succinamide.

Among the above cationic polymers, from the viewpoint of further enhancing the polishing selectivity of the insulating material to the stopper material and from the viewpoint of further enhancing the polishing rate of the insulating material, an amine polymer which is a polymer obtained by polymerizing allylamine, diallylamine or vinylamine is preferable. The cationic polymer can be used singly or in combination of two or more for the purpose of adjusting polishing characteristics such as polishing selectivity and flatness.

The lower limit of the weight average molecular weight of the cationic polymer is preferably 100 or more, more preferably 300 or more, further preferably 500 or more, from the viewpoint of further enhancing the polishing selectivity of the insulating material to the stopper material. The upper limit of the weight average molecular weight of the cationic polymer is preferably 1000000 or less, more preferably 600000 or less, further preferably 300000 or less, from the viewpoint of further enhancing the polishing selectivity of the insulating material to the stopper material. Herein, the weight average molecular weight of the cationic polymer can be measured by the same method as in the weight average molecular weight of the first additive.

The lower limit of the content of the cationic polymer is preferably 0.0001 mass % or more, more preferably 0.0002 mass % or more, further preferably 0.0005 mass % or more, particularly preferably 0.0008 mass % or more based on the total mass of the polishing agent, from the viewpoint of further enhancing the polishing selectivity of the insulating material to the stopper material, and flatness. The upper limit of the content of the cationic polymer is preferably 5 mass % or less, more preferably 3 mass % or less, further preferably 1 mass % or less, particularly preferably 0.5 mass % or less, extremely preferably 0.1 mass % or less, very preferably 0.05 mass % or less, particularly preferably 0.01 mass % or less, further preferably 0.005 mass % or less based on the total mass of the polishing agent, from the viewpoint that the polishing selectivity of the insulating material to the stopper material is further excellent. Herein, in the case where a plurality of compounds is used for the cationic polymer, it is preferable that the total of the contents of the respective compounds satisfy the above range. It is preferable that the content of the cationic polymer be appropriately adjusted depending on the preparation method of the insulating material (type and film formation conditions) from the viewpoint of further enhancing the polishing rate of the insulating material, the polishing selectivity of the insulating material to the stopper material, and flatness.

[Other Additives]

The polishing agent according to the present embodiment may further contain other additives in addition to the first additive and the second additive for the purpose of adjusting polishing characteristics. Examples of other additives include carboxylic acids, amino acids, a water-soluble polymer, an oxidant (for example, hydrogen peroxide), and a pH adjuster and a buffer described later. These can be used singly or in combination of two or more.

In the case where other additives are used, the content thereof is preferably 0.0001 mass % or more and 10 mass % or less based on the total mass of the polishing agent from the viewpoint of obtaining the adding effect of the additive while suppressing precipitation of the abrasive grain. Herein, in the case where a plurality of compounds is used for such an additive, it is preferable that the total of the contents of the respective compounds satisfy the above range.

Carboxylic acids have the effect of not only stabilizing the pH but also further enhancing the polishing rate of the insulating material. Examples of carboxylic acids include formic acid, acetic acid, propionic acid, butyric acid, valeric acid, caproic acid and lactic acid.

Amino acids have the effects of enhancing the dispersibility of the abrasive grain (in particular, the abrasive grain including the hydroxide of a tetravalent metal element) and further enhancing the polishing rate of the insulating material. Examples of amino acids include arginine, lysine, aspartic acid, glutamic acid, asparagine, glutamine, histidine, proline, tyrosine, tryptophan, serine, threonine, glycine, alanine, β-alanine, methionine, cysteine, phenylalanine, leucine, valine and isoleucine.

The water-soluble polymer has the effect of adjusting polishing characteristics such as flatness, in-plane uniformity, the polishing selectivity of silicon oxide to silicon nitride (polishing rate of silicon oxide/polishing rate of silicon nitride), and the polishing selectivity of silicon oxide to polysilicon (polishing rate of silicon oxide/polishing rate of polysilicon). Herein, the "water-soluble polymer" is defined as a polymer which is dissolved in 100 g of water in an amount of 0.1 g or more. The polymers corresponding to the first additive and the second additive are not included in the "water-soluble polymer".

Specific examples of the water-soluble polymer include, not particularly limited, polysaccharides such as alginic acid, pectinic acid, carboxymethylcellulose, agar, curdlan, dextrin, cyclodextrin and pullulan; vinyl type polymers such as polyvinyl alcohol, polyvinylpyrrolidone and polyacrolein; and glycerol type polymers such as polyglycerol and polyglycerol derivatives. The water-soluble polymer can be used singly or in combination of two or more.

In the case where the water-soluble polymer is used, the lower limit of the content of the water-soluble polymer is preferably 0.0001 mass % or more, more preferably 0.001 mass % or more, further preferably 0.01 mass % or more based on the total mass of the polishing agent, from the viewpoint of obtaining the adding effect of the water-soluble polymer while suppressing precipitation of the abrasive grain. The upper limit of the content of the water-soluble polymer is preferably 10 mass % or less, more preferably 5 mass % or less, further preferably 1 mass % or less, particularly preferably 0.5 mass % or less based on the total mass of the polishing agent from the viewpoint of obtaining the adding effect of the water-soluble polymer while suppressing precipitation of the abrasive grain. In the case where a plurality of compounds is used for the water-soluble polymer, it is preferable that the total of the contents of the respective compounds satisfy the above range.

(Liquid Medium)

The liquid medium in the polishing agent according to the present embodiment is not particularly limited, but is preferably water such as deionized water and ultrapure water. The content of the liquid medium may correspond to the amount of the remaining polishing agent from which the contents of other constituents are removed, and is not particularly limited.

(Characteristics of Polishing Agent)

The pH of the polishing agent according to the present embodiment is preferably 3.0 or more and 12.0 or less from the viewpoint that the storage stability of the polishing agent and the polishing rate of the insulating material are further excellent. Herein, the pH is defined as the pH at a liquid temperature of 25° C. The pH of the polishing agent mainly has an effect on the polishing rate. The lower limit of the pH is more preferably 4.0 or more, further preferably 4.5 or more, particularly preferably 5.0 or more, from the viewpoint of further enhancing the polishing rate of the insulating material. The upper limit of the pH is more preferably 11.0 or less, further preferably 10.0 or less, particularly preferably 9.0 or less, extremely preferably 8.0 or less, very preferably 7.0 or less, from the viewpoint of further enhancing the polishing rate of the insulating material.

The pH of the polishing agent can be adjusted by a pH adjuster, for example, an acid component such as an inorganic acid or an organic acid; or an alkali component such as ammonia, sodium hydroxide, tetramethylammonium hydroxide (TMAH) or imidazole. In order to stabilize the pH, a buffer may also be used, and a buffer solution (buffer-containing liquid) may be used as the buffer. Examples of such a buffer solution include an acetate buffer solution and a phthalate buffer solution.

The pH of the polishing agent according to the present embodiment can be measured by a pH meter (for example, Model number PHL-40 manufactured by Denki Kagaku Keiki Co., Ltd.). Specifically, for example, after performing 2-point calibration of the pH meter using a phthalate pH buffer solution (pH 4.01) and a neutral phosphate pH buffer solution (pH 6.86) as a standard buffer solution, an electrode of the pH meter is placed in the polishing agent for 2 minutes or more, and the value after stabilization is measured. In this case, both the liquid temperatures of the standard buffer solution and the polishing agent are set to 25° C.

The polishing agent according to the present embodiment may be stored as a one-liquid polishing agent containing at least the abrasive grain, the first additive, the second additive and a liquid medium, or as a two-liquid polishing agent set in which the constituents of the polishing agent are separated to a slurry (first liquid) and an additive liquid (second liquid) so that the slurry and the additive liquid are mixed to provide the polishing agent. The slurry contains at least, for example, the abrasive grain and a liquid medium. The additive liquid contains at least, for example, the first additive, the second additive and a liquid medium. It is preferable that the first additive, the second additive and other additive be contained in the additive liquid among the slurry and the additive liquid. Herein, the constituents of the polishing agent may be stored as a polishing agent set with being separated to three or more liquids.

In the polishing agent set, the slurry and the additive liquid are mixed immediately before polishing or in polishing to prepare the polishing agent. Also, the one-liquid polishing agent may be stored as a stock solution for the polishing agent in which the content of the liquid medium is reduced, and used with being diluted with the liquid medium in polishing. The two-liquid polishing agent set may be stored as a stock solution for the slurry and a stock solution for the additive liquid, in which the content of the liquid medium is reduced, and used with being diluted with the liquid medium in polishing.

In the case of the one-liquid polishing agent, as the method of supplying the polishing agent on a polishing platen, a method of directly sending the polishing agent for supplying; a method of sending the stock solution for the polishing agent and the liquid medium through separate pipe arrangements, and converging these to mix for supplying; a method of mixing the stock solution for the polishing agent and the liquid medium in advance for supplying, or the like can be used.

In the case of storing as the two-liquid polishing agent set in which the slurry and the additive liquid are separated, the ratio of these two liquids blended can be arbitrarily varied to thereby adjust the polishing rate. In the case of polishing using the polishing agent set, the Examples of the method for supplying the polishing agent on a polishing platen include methods shown below. For example, a method of sending the slurry and the additive liquid through separate pipe arrangements, and converging these pipe arrangements to mix for supplying; a method of sending the stock solution for the slurry, the stock solution for the additive liquid, and the liquid medium through separate pipe arrangements, and converging these to mix for supplying; or a method of mixing the slurry and the additive liquid in advance for supplying; a method of mixing the stock solution for the slurry, the stock solution for the additive liquid, and the liquid medium in advance for supplying can be used. Alternatively, a method of supplying each of the slurry and the additive liquid of the polishing agent set on a polishing platen can also be used. In this case, the surface to be polished is polished using a polishing agent obtained by mixing the slurry and the additive liquid on the polishing platen.

Herein, the polishing agent set according to the present embodiment may be a mode in which the set is separated to the polishing agent containing at least the essential components, and the additive liquid containing at least an optional component such as an oxidant (for example, hydrogen peroxide). In this case, polishing is performed using a mixed liquid (such mixed liquid also corresponds to "polishing agent") obtained by mixing the polishing agent and the additive liquid. Alternatively, the polishing agent set according to the present embodiment may be a mode as a polishing agent set separated to three or more liquids, in which the set is separated to a liquid containing at least a part of the essential components, a liquid containing at least the residue of the essential components, and an additive liquid containing at least an optional component. Each of the liquids for constituting the polishing agent set may be stored as the stock solution in which the content of the liquid medium is reduced.

<Method for Polishing Base>

A method for polishing a base according to the present embodiment may comprise a polishing step of polishing a surface to be polished of a base using the polishing agent. In the polishing step, for example, while a material to be polished of a base having the material to be polished is pressed on a polishing pad (polishing cloth) of a polishing platen, the polishing agent is supplied between the material to be polished and the polishing pad, and the base and the polishing platen are relatively moved to polish the material to be polished. In the polishing step, for example, at least a part of the material to be polished is removed by polishing.

The method for polishing a base according to the present embodiment may comprise a polishing step of polishing a surface to be polished of a base using a polishing agent obtained by mixing the slurry and the additive liquid of the polishing agent set. In this case, the method for polishing a base may further comprise a step of mixing the slurry and the additive liquid to obtain the polishing agent before the polishing step. In the polishing step, by supplying the slurry and the additive liquid of the polishing agent set between the material to be polished and the polishing pad, the surface to be polished of a base may also be polished using a polishing agent obtained by mixing the slurry and the additive liquid.

The base, being a subject to be polished, includes a substrate and the like, and examples thereof include a substrate where the material to be polished is formed on a substrate relating to semiconductor element production (for example, a semiconductor substrate on which an STI pattern, a gate pattern, a wiring pattern and the like are formed). Examples of the material to be polished include insulating materials such as silicon oxide; and stopper materials such as polysilicon and silicon nitride. The shape of the material to be polished is not particularly limited, but, for example, is in the form of a film (film to be polished). The film to be polished may be a single layer or a plurality of films. In the case where a plurality of films is exposed on the surface to be polished, these can be each assumed to be the film to be polished.

Such a material to be polished (for example, an insulating material such as silicon oxide) formed on the substrate is polished by the polishing agent to remove an excess region, thereby making it possible to eliminate irregularities on the surface of the material to be polished, providing a flat and smooth surface overall the surface of the material to be polished. It is preferable that the polishing agent according to the present embodiment be used for polishing a surface to be polished including silicon oxide.

In the present embodiment, it is possible to polish an insulating film, including silicon oxide at least at the surface thereof (for example, silicon oxide film), of a base having the insulating film, a stopper film disposed as an underlayer of the insulating film, and a semiconductor substrate disposed under the stopper film. The stopper film is, for example, a film in which the polishing rate is lower than that of the insulating film, and is preferably a polysilicon film, a silicon nitride film or the like. With respect to such a base, polishing can be stopped at the time of exposing the stopper film to thereby prevent the insulating film from being excessively polished, and thus the flatness after polishing of the insulating film can be enhanced.

Examples of the method for preparing the film to be polished, which is to be polished by the polishing agent according to the present embodiment, include a CVD method typified by a low-pressure CVD method, a sub-atmospheric CVD method and a plasma CVD method; and a rotation application method in which a liquid raw material is applied to a rotating substrate.

The silicon oxide film is obtained by, for example, subjecting monosilane ($SiH_4$) and oxygen ($O_2$) to a heat reaction using a low-pressure CVD method. Alternatively, the silicon oxide film is obtained by, for example, subjecting tetraethoxysilane ($Si(OC_2H_5)_4$) and ozone ($O_3$) to a heat reaction using a sub-atmospheric CVD method. With respect to other examples, the silicon oxide film is similarly obtained by subjecting tetraethoxysilane and oxygen to a plasma reaction.

The silicon oxide film is obtained by, for example, applying a liquid raw material including inorganic polysilazane, inorganic siloxane or the like onto a substrate using a rotation application method, and conducting a heat-curing reaction in a furnace or the like.

Examples of the method for forming the polysilicon film include a low-pressure CVD method of subjecting monosilane to a heat reaction, and a plasma CVD method of subjecting monosilane to a plasma reaction.

In order to stabilize the quality of each of the silicon oxide film, the polysilicon film and the like obtained by the above methods, a heat treatment may be performed at a temperature of 200 to 1000° C. if necessary. The silicon oxide film obtained by the above method may include a slight amount of boron (B), phosphorus (P), carbon (C), and the like for an increase in embedding property.

Hereinafter, the polishing method according to the present embodiment is further described by taking a method for polishing a semiconductor substrate having an insulating film formed, as an example. In the polishing method according to the present embodiment, it is possible to use, as a polishing apparatus, a common polishing apparatus which has a holder capable of holding a base such as a semiconductor substrate having a surface to be polished, and a polishing platen to which a polishing pad can be pasted. A motor or the like in which the number of rotations can be changed is attached to each of the holder and the polishing platen. As the polishing apparatus, it is possible to use a polishing apparatus Reflexion manufactured by APPLIED MATERIALS Inc.

As the polishing pad, it is possible to use, for example, common unwoven cloth, foamed body or unfoamed body. As the material of the polishing pad, it is possible to use a resin such as polyurethane, acrylics, polyester, an acrylic-ester copolymer, polytetrafluoroethylene, polypropylene, polyethylene, poly(4-methylpentene), cellulose, cellulose ester, polyamide (for example, Nylon (trade name), aramid), polyimide, polyimidamide, a polysiloxane copolymer, an oxirane compound, a phenol resin, polystyrene, polycarbonate and an epoxy resin. As the material of the polishing pad, particularly preferable are foamed polyurethane and unfoamed polyurethane, from the viewpoint that excellent polishing rate and flatness are easily obtained. It is preferable that the polishing pad be subjected to grooving so that the polishing agent is pooled.

Polishing conditions are not particularly limited, but the rotation speed of the platen is preferably 200 $min^{-1}$ or less so that the semiconductor substrate is not let out, and the polishing pressure to be applied to the semiconductor substrate (processing load) is preferably 100 kPa or less from the viewpoint of sufficiently inhibiting polishing scratches from being generated. It is preferable to continuously supply the polishing agent to the polishing pad by a pump or the like during polishing. The amount of supply thereof is not limited, but it is preferable that the surface of the polishing pad be always covered with the polishing agent.

It is preferable that the semiconductor substrate after the completion of polishing be well washed with flowing water to remove a particle attached to the substrate. For the washing, dilute hydrofluoric acid or ammonia water may be used in addition to pure water, and a brush may be used for an increase in washing effect. After the washing, it is preferable that a spin dryer or the like be used to flick a water droplet attached to the semiconductor substrate and then dry the semiconductor substrate.

The polishing agent, the polishing agent set and the polishing method according to the present embodiment can be suitably used for formation of STI. It is preferable for formation of STI that the polishing rate ratio of the insulating material (for example, silicon oxide) to the stopper material (for example, polysilicon) be 100 or more. In the case where the polishing rate ratio is less than 100, the magnitude of the polishing rate of the insulating material to the polishing rate of the stopper material is small, and polishing tends to be hardly stopped at a predetermined position in formation of STI. On the other hand, in the case where the polishing rate ratio is 100 or more, polishing is easily stopped and such a case is further suitable for formation of STI. The polishing rate ratio is more preferably 300 or more, further preferably 500 or more, particularly preferably 1000 or more.

The polishing agent, the polishing agent set and the polishing method according to the present embodiment can also be used for polishing of a pre-metal insulating film. For the constituting material of the pre-metal insulating film (pre-metal insulating material), for example, phosphorus-silicate glass or boron-phosphorus-silicate glass is used, and furthermore, silicon oxyfluoride, fluorinated amorphous carbon or the like can also be used, in addition to silicon oxide.

The polishing agent, the polishing agent set and the polishing method according to the present embodiment can also be applied to a film other than the insulating film such as a silicon oxide film. Examples of such a film include high-dielectric-constant films of Hf-based, Ti-based, or Ta-based oxides; semiconductor films of silicon, amorphous silicon, SiC, SiGe, Ge, GaN, GaP, GaAs, or an organic semiconductor; phase change films of GeSbTe or the like; inorganic conductive films of ITO or the like; and polyimide type, polybenzoxazole type, acrylic, epoxy type, or phenol type polymer resin films.

The polishing agent, the polishing agent set and the polishing method according to the present embodiment can also be applied not only to a film-like polishing subject but also to various substrates formed from glass, silicon, SiC, SiGe, Ge, GaN, GaP, GaAs, sapphire, plastic or the like.

The polishing agent, the polishing agent set and the polishing method according to the present embodiment can also be used for not only production of the semiconductor element, but also production of image display devices such as TFT and organic EL; optical components such as a photo mask, lens, prism, an optical fiber and a single crystal scintillator; optical elements such as an optical switching element and an optical waveguide; light-emitting elements such as solid laser and blue laser LED; and magnetic-storage devices such as a magnetic disc and a magnetic head.

EXAMPLES

Hereinafter, the present invention is specifically described based on Examples, but the present invention is not limited thereto.

<Synthesis of Hydroxide of Tetravalent Metal Element>

350 g of 50 mass % $Ce(NH_4)_2(NO_3)_6$ aqueous solution (product name: CAN50 liquid, produced by Nihon Kagaku Sangyo Co., Ltd.) was dissolved in 7825 g of pure water to obtain a solution. Then, while this solution was stirred, 750 g of an imidazole aqueous solution (10 mass % aqueous solution) was dropped at a rate of 5 mL/min to obtain a precipitate including hydroxide of cerium.

After the precipitate including hydroxide of cerium was subjected to centrifugation (4000 $min^{-1}$ for 5 minutes), a liquid phase was removed by decantation to thereby perform solid-solution separation. In addition, 10 g of the resulting particle and 990 g of water were mixed, and the particle was dispersed in water using an ultrasonic washing machine, to prepare a stock solution for a slurry (content of particle: 1.0 mass %).

The average particle diameter of the particle in the stock solution for a slurry was measured using N5 (trade name) manufactured by Beckman Coulter, and found to be 25 nm. The measurement method is as follows. First, about 1 mL of a measurement sample (aqueous dispersion) including 1.0 mass % of a particle of hydroxide of cerium was placed in a cell of 1 cm square, and thereafter the cell was set up in N5. After the refractive index of the measurement sample was adjusted to 1.333 and the viscosity of the measurement sample was adjusted to 0.887 mPa·s, the measurement was performed at 25° C., and the value represented as Unimodal Size Mean was read.

The stock solution for a slurry was taken in an appropriate amount and diluted with water so that the content of the particle was 0.0065 mass %, to obtain a measurement sample (aqueous dispersion). About 4 mL of the measurement sample was placed in a cell of 1 cm square, and the cell was set up in a spectrophotometer (apparatus name: U3310) manufactured by Hitachi Ltd. Measurement of the absorbance was performed in the wavelength range from 200 to 600 nm, and the absorbance for light with a wavelength of 290 nm and the absorbance for light with a wavelength of 450 to 600 nm were measured. The absorbance for light with a wavelength of 290 nm was 1.192, and the absorbance for light with a wavelength of 450 to 600 nm was less than 0.010.

About 4 mL of the stock solution for a slurry (content of particle: 1.0 mass %) was placed in a cell of 1 cm square, and the cell was set up in a spectrophotometer (apparatus name: U3310) manufactured by Hitachi Ltd. Measurement of the absorbance was performed in the wavelength range from 200 to 600 nm, and the absorbance for light with a wavelength of 400 nm and the light transmittance for light with a wavelength of 500 nm were measured. The absorbance for light with a wavelength of 400 nm was 2.25, and the light transmittance for light with a wavelength of 500 nm was 92%/cm.

The stock solution for a slurry was taken in an appropriate amount and dried under vacuum to isolate an abrasive grain. A specimen obtained by sufficient washing with pure water was subjected to measurement according to the FT-IR ATR method, and a peak based on a nitrate ion ($NO_3^-$) was observed in addition to a peak based on a hydroxide ion. In addition, this specimen was subjected to XPS (N-XPS) measurement with respect to nitrogen, and a peak based on $NH_4^+$ was not observed, but a peak based on a nitrate ion was observed. It has been confirmed from these results that the abrasive grain contained in the stock solution for a slurry at least partially contains a particle having a nitrate ion bound to a cerium element.

Preparation of Polishing Agent for CMP

Example 1

100 g of a stock solution for an additive liquid, containing 2 mass % of polyoxyethylene styrenated phenyl ether [Noigen EA-207D produced by Dai-Ichi Kogyo Seiyaku Co., Ltd., weight average molecular weight: 4500], 0.08 mass % of imidazole, 0.05 mass % of acetic acid and 97.87 mass % of water, 50 g of the stock solution for a slurry obtained above, 820 g of water, and 30 g of an aqueous solution containing, as a cationic polymer, 0.1 mass % of a diallyldimethylammonium chloride-acrylamide copolymer [PAS-J-81 produced by Nittobo Medical Co., Ltd., weight average molecular weight: 200000] were mixed, to thereby prepare a polishing agent for CMP containing 0.05 mass % of an abrasive grain including hydroxide of cerium, 0.2 mass % of the polyoxyethylene styrenated phenyl ether and 0.003 mass % of the diallyldimethylammonium chloride-acrylamide copolymer.

Example 2

The same manner as in Example 1 was performed except for the contents of the polyoxyethylene styrenated phenyl ether and the diallyldimethylammonium chloride-acrylamide copolymer, to prepare a polishing agent for CMP containing 0.05 mass % of an abrasive grain including hydroxide of cerium, 0.5 mass % of the polyoxyethylene styrenated phenyl ether and 0.0015 mass % of the diallyldimethylammonium chloride-acrylamide copolymer.

Example 3

The same manner as in Example 2 was performed except for the content of the diallyldimethylammonium chloride-acrylamide copolymer, to prepare a polishing agent for CMP containing 0.05 mass % of an abrasive grain including hydroxide of cerium, 0.5 mass % of the polyoxyethylene styrenated phenyl ether and 0.003 mass % of the diallyldimethylammonium chloride-acrylamide copolymer.

Example 4

The same manner as in Example 3 was performed except for the contents of the polyoxyethylene styrenated phenyl ether, imidazole and acetic acid, to prepare a polishing agent for CMP containing 0.05 mass % of an abrasive grain including hydroxide of cerium, 1.0 mass % of the polyoxyethylene styrenated phenyl ether and 0.003 mass % of the diallyldimethylammonium chloride-acrylamide copolymer.

Example 5

The same manner as in Example 3 was performed except for the content of imidazole, to prepare a polishing agent for CMP containing 0.05 mass % of an abrasive grain including hydroxide of cerium, 0.5 mass % of the polyoxyethylene styrenated phenyl ether and 0.003 mass % of the diallyldimethylammonium chloride-acrylamide copolymer.

Example 6

The same manner as in Example 3 was performed except for the content of imidazole, to prepare a polishing agent for CMP containing 0.05 mass % of an abrasive grain including hydroxide of cerium, 0.5 mass % of the polyoxyethylene styrenated phenyl ether and 0.003 mass % of the diallyldimethylammonium chloride-acrylamide copolymer.

Example 7

The same manner as in Example 3 was performed except for the type and the content of the cationic polymer, to prepare a polishing agent for CMP containing 0.05 mass % of an abrasive grain including hydroxide of cerium, 0.5 mass % of the polyoxyethylene styrenated phenyl ether and 0.001 mass % of polyallylamine [PAA-01 produced by Nittobo Medical Co., Ltd., weight average molecular weight: 1600].

Example 8

The same manner as in Example 3 was performed except for the type of the cationic polymer, to prepare a polishing agent for CMP containing 0.05 mass % of an abrasive grain including hydroxide of cerium, 0.5 mass % of the polyoxyethylene styrenated phenyl ether and 0.003 mass % of a diallyldimethylammonium chloride polymer [PAS-H-10L produced by Nittobo Medical Co., Ltd., weight average molecular weight: 200000].

Example 9

The same manner as in Example 3 was performed except for the type of the cationic polymer, to prepare a polishing agent for CMP containing 0.05 mass % of an abrasive grain including hydroxide of cerium, 0.5 mass % of the polyoxyethylene styrenated phenyl ether and 0.003 mass % of a diallyldimethylammonium chloride-acrylamide copolymer [PAS-J-81L produced by Nittobo Medical Co., Ltd., weight average molecular weight: 10000].

Example 10

The same manner as in Example 3 was performed except for the type of the aromatic polyoxyalkylene compound, to prepare a polishing agent for CMP containing 0.05 mass % of an abrasive grain including hydroxide of cerium, 0.5 mass % of a polyoxyethylene alkylphenyl ether [Emulsit 49 produced by Dai-Ichi Kogyo Seiyaku Co., Ltd., weight average molecular weight: 3000] and 0.003 mass % of the diallyldimethylammonium chloride-acrylamide copolymer.

Comparative Example 1

50 g of the stock solution for a slurry obtained above, 940 g of water and 10 g of 1 mass % imidazole aqueous solution were mixed, to prepare a polishing agent for CMP containing 0.05 mass % of an abrasive grain including hydroxide of cerium.

Comparative Example 2

100 g of a stock solution for an additive liquid, containing 5 mass % of polyethylene glycol [PEG#600 produced by Lion Corporation, weight average molecular weight: 600], 0.08 mass % of imidazole, 0.05 mass % of acetic acid and 94.87 mass % of water, 50 g of the stock solution for a slurry obtained above, and 850 g of water were mixed, to prepare a polishing agent for CMP containing 0.05 mass % of an abrasive grain including hydroxide of cerium and 0.5 mass % of polyethylene glycol.

Comparative Example 3

100 g of a stock solution for an additive liquid, containing 5 mass % of polyoxyethylene styrenated phenyl ether [Noigen EA-207D produced by Dai-Ichi Kogyo Seiyaku Co., Ltd., weight average molecular weight: 4500], 0.08 mass % of imidazole, 0.05 mass % of acetic acid and 94.87 mass % of water, 50 g of the stock solution for a slurry obtained above, and 850 g of water were mixed, to prepare a polishing agent for CMP containing 0.05 mass % of an abrasive grain including hydroxide of cerium and 0.5 mass % of the polyoxyethylene styrenated phenyl ether.

Comparative Example 4

100 g of a stock solution for an additive liquid, containing 5 mass % of polyvinyl alcohol [PVA-403 produced by Kuraray Co., Ltd., average degree of polymerization: 300, degree of saponification: 80% by mol, weight average molecular weight: 14000], 0.08 mass % of imidazole, 0.05 mass % of acetic acid and 94.87 mass % of water, 50 g of the stock solution for a slurry obtained above, and 850 g of water were mixed, to prepare a polishing agent for CMP containing 0.05 mass % of an abrasive grain including hydroxide of cerium and 0.5 mass % of the polyvinyl alcohol.

Comparative Example 5

The same manner as in Comparative Example 4 was performed except that polyallylamine [PAA-01 produced by Nittobo Medical Co., Ltd., weight average molecular weight: 1600] was added as the cationic polymer, to prepare a polishing agent for CMP containing 0.05 mass % of an abrasive grain including hydroxide of cerium, 0.5 mass % of the polyvinyl alcohol and 0.0001 mass % of the polyallylamine.

Comparative Example 6

The same manner as in Comparative Example 4 was performed except that polyallylamine [PAA-08 produced by Nittobo Medical Co., Ltd., weight average molecular weight: 8000] was added as the cationic polymer, to prepare a polishing agent for CMP containing 0.05 mass % of an abrasive grain including hydroxide of cerium, 0.5 mass % of the polyvinyl alcohol and 0.0008 mass % of the polyallylamine.

Comparative Example 7

The same manner as in Example 2 was performed except that polyethylene glycol [PEG#600 produced by Lion Corporation, weight average molecular weight: 600] was used instead of the aromatic polyoxyalkylene compound, to prepare a polishing agent for CMP containing 0.05 mass % of an abrasive grain including hydroxide of cerium, 0.5 mass % of the polyethylene glycol and 0.0015 mass % of the diallyldimethylammonium chloride-acrylamide copolymer.

Comparative Example 8

The same manner as in Example 4 was performed except that polyethylene glycol [PEG#600 produced by Lion Corporation, weight average molecular weight: 600] was used instead of the aromatic polyoxyalkylene compound, to prepare a polishing agent for CMP containing 0.05 mass % of an abrasive grain including hydroxide of cerium, 1.0 mass % of the polyethylene glycol and 0.003 mass % of the diallyldimethylammonium chloride-acrylamide copolymer.

Comparative Example 9

The same manner as in Example 5 was performed except that polyethylene glycol [PEG#600 produced by Lion Corporation, weight average molecular weight: 600] was used instead of the aromatic polyoxyalkylene compound, to prepare a polishing agent for CMP containing 0.05 mass % of an abrasive grain including hydroxide of cerium, 0.5 mass % of the polyethylene glycol and 0.003 mass % of the diallyldimethylammonium chloride-acrylamide copolymer.

Comparative Example 10

The same manner as in Example 3 was performed except that polyethylene glycol [PEG#600 produced by Lion Corporation, weight average molecular weight: 600] was used instead of the aromatic polyoxyalkylene compound, to prepare a polishing agent for CMP containing 0.05 mass % of an abrasive grain including hydroxide of cerium, 0.5 mass % of the polyethylene glycol and 0.003 mass % of the diallyldimethylammonium chloride-acrylamide copolymer.

Comparative Example 11

The same manner as in Example 6 was performed except that polyethylene glycol [PEG#600 produced by Lion Corporation, weight average molecular weight: 600] was used instead of the aromatic polyoxyalkylene compound, to prepare a polishing agent for CMP containing 0.05 mass % of an abrasive grain including hydroxide of cerium, 0.5 mass % of the polyethylene glycol and 0.003 mass % of the diallyldimethylammonium chloride-acrylamide copolymer.

Comparative Example 12

The same manner as in Example 3 was performed except that polyethylene glycol [PEG#4000 produced by Lion Corporation, weight average molecular weight: 4000] was used instead of the aromatic polyoxyalkylene compound, to prepare a polishing agent for CMP containing 0.05 mass % of an abrasive grain including hydroxide of cerium, 0.5 mass % of the polyethylene glycol and 0.003 mass % of the diallyldimethylammonium chloride-acrylamide copolymer.

Comparative Example 13

The same manner as in Example 3 was performed except that polyoxyethylene styrenated phenyl ether [Noigen EA-137 produced by Dai-Ichi Kogyo Seiyaku Co., Ltd., weight average molecular weight: 700] was used as the aromatic polyoxyalkylene compound, to prepare a polishing agent for CMP containing 0.05 mass % of an abrasive grain including hydroxide of cerium, 0.5 mass % of the polyoxyethylene styrenated phenyl ether and 0.003 mass % of the diallyldimethylammonium chloride-acrylamide copolymer.

Comparative Example 14

The same manner as in Example 3 was performed except that polyoxyethylene lauryl ether [Emulgen 130K produced by Kao Corporation] was used instead of the aromatic polyoxyalkylene compound, to prepare a polishing agent for CMP containing 0.05 mass % of an abrasive grain including hydroxide of cerium, 0.5 mass % of the polyoxyethylene lauryl ether and 0.003 mass % of the diallyldimethylammonium chloride-acrylamide copolymer.

Comparative Example 15

The same manner as in Example 3 was performed except that an EO (ethylene oxide) adduct of acetylene diol [Surfynol 465 produced by Nissin Chemical Co., Ltd.] was used instead of the aromatic polyoxyalkylene compound, to prepare a polishing agent for CMP containing 0.05 mass % of an abrasive grain including hydroxide of cerium, 0.5 mass % of the EO adduct of acetylene diol and 0.003 mass % of the diallyldimethylammonium chloride-acrylamide copolymer.

Comparative Example 16

100 g of a stock solution for an additive liquid, containing 5 mass % of polyglycerol [polyglycerol #750 produced by Sakamoto Yakuhin Kogyo Co., Ltd., weight average molecular weight: 750], 0.08 mass % of imidazole, 0.05 mass % of acetic acid and 94.87 mass % of water, 50 g of the stock solution for a slurry obtained above, 830 g of water, and 20 g of an aqueous solution containing, as a cationic polymer, 0.1 mass % of polyallylamine [PAA-01 produced by Nittobo Medical Co., Ltd., weight average molecular weight: 1600] were mixed, to prepare a polishing agent for CMP containing 0.05 mass % of an abrasive grain including hydroxide of cerium, 0.5 mass % of the polyglycerol and 0.002 mass % of the polyallylamine.

Comparative Example 17

The same manner as in Example 7 was performed except that polyoxyethylene polyglyceryl ether [SC-E2000 produced by Sakamoto Yakuhin Kogyo Co., Ltd., weight average molecular weight: 2000] was used instead of the aromatic polyoxyalkylene compound, to prepare a polishing agent for CMP containing 0.05 mass % of an abrasive grain including hydroxide of cerium, 0.5 mass % of the polyoxyethylene polyglyceryl ether and 0.001 mass % of the polyallylamine.

<Evaluation of Physical Properties of Polishing Agent>

The pH of each of the polishing agents for CMP obtained above, and the average particle diameter of the abrasive grain in each of the polishing agents for CMP were evaluated under the following conditions.

(pH)

Measurement temperature: 25±5° C.

Measurement apparatus: Model Number PHL-40 manufactured by Denki Kagaku Keiki Co., Ltd.

Measurement method: after performing 2-point calibration using a standard buffer solution (phthalate pH buffer solution, pH: 4.01 (25° C.); neutral phosphate pH buffer solution, pH 6.86 (25° C.)), an electrode was placed in the polishing agent for CMP for 2 minutes or more, and pH after stabilization was measured with the measurement apparatus above.

(Average Particle Diameter of Abrasive Grain)

The average particle diameter of the abrasive grain in each of the polishing agents for CMP was measured using N5 (trade name) manufactured by Beckman Coulter. The measurement method is as follows. First, about 1 mL of each of the polishing agents for CMP was placed in a cell of 1 cm square, and the cell was then set up in N5. After the refractive index of the measurement sample was adjusted to 1.333 and the viscosity of the measurement sample was adjusted to 0.887 mPa·s, the measurement was performed at 25° C., and the value represented as Unimodal Size Mean was read.

<CMP Evaluation>

Each of the polishing agents for CMP was used to polish a substrate to be polished, under the following polishing conditions. In Comparative Example 1, however, polishing of a patterned wafer was not performed.

(CMP Polishing Conditions)

Polishing apparatus: Reflexion (manufactured by APPLIED MATERIALS Inc.)

Flow rate of polishing agent for CMP: 200 mL/min

Substrate to be polished: "unpatterned wafer" and "patterned wafer" below

Polishing pad: foamed polyurethane resin having closed pores (Mode Number IC 1010 produced by Rohm and Haas Japan K. K.)

Polishing pressure: 16.5 kPa (2.4 psi)

Relative speed between substrate and polishing platen: 85 m/min

Polishing time: a blanket wafer was polished for 1 minute. The patterned wafer was polished until a polysilicon film as a stopper film was exposed. In addition, additional polishing was performed for the same time as the polishing time taken for exposing the polysilicon film, to confirm the degree of widening of the difference in thickness of the polysilicon film.

Washing: after a CMP treatment, washing was performed by ultrasonic water and then drying by a spin dryer was performed.

[Unpatterned Wafer]

For a blanket wafer with no patterns formed, a substrate where a silicon oxide film having a thickness of 1 µm was formed on a silicon substrate by the plasma CVD method, and a substrate where a polysilicon film having a thickness of 0.2 µm was formed on a silicon substrate by the CVD method were used.

[Patterned Wafer]

For a patterned wafer with a simulated pattern formed, 764 wafer (trade name, diameter: 300 mm) manufactured by SEMATECH was used. The patterned wafer was a wafer obtained by stacking a polysilicon film as a stopper film on a silicon substrate, then forming a trench in an exposure step, and stacking a silicon oxide film ($SiO_2$ film) as an insulating film on the silicon substrate and the polysilicon film so as to fill the polysilicon film and the trench. The silicon oxide film was formed by the HDP (High Density Plasma) method.

As the patterned wafer, one having a region with a line and space having a pitch of 100 µm and a convex pattern density of 20%, 30%, 50% and 80% was used. The patterned wafer has, as a simulated pattern, a pattern in which an Active region (convex region) masked by the polysilicon film and a Trench region (concave region) with a groove formed are alternately arranged. For example, the phrase "a line and space having a pitch of 100 µm" means that the total of the width of a line region and that of a space region is 100 µm. In addition, for example, the phrase "with a line and space having a pitch of 100 µm and a convex pattern density of 20%" means a pattern in which a convex region having a convex width of 20 µm and a concave region having a width of 80 µm are alternately arranged.

In the patterned wafer, the thickness of the silicon oxide film was 600 nm on each of the silicon substrate and the polysilicon film. Specifically, as illustrated in FIG. 1, the thickness of a polysilicon film 2 on a silicon substrate 1 was 150 nm, the thickness of a convex region of a silicon oxide film 3 was 600 nm, the thickness of a concave region of the silicon oxide film 3 was 600 nm, and the depth of the concave region of the silicon oxide film 3 was 500 nm (depth of trench: 350 nm+thickness of polysilicon film: 150 nm).

In polishing evaluation of the patterned wafer, a known polishing agent for CMP capable of obtaining self-stopping property (property for reducing the polishing rate in accordance with a decrease in the remaining step height in the simulated pattern) was used to polish the wafer, and a wafer where the remaining step height was 100 nm or less was used. Specifically, a wafer, which was polished until the thickness of the silicon oxide film of the convex region in the region with a pitch of 100 µm and a convex pattern density of 50% reached 100 nm using a polishing agent in which HS-8005-D4 manufactured by Hitachi Chemical Co., Ltd., HS-7303GP manufactured by Hitachi Chemical Co., Ltd., and water were blended in a ratio of 2:1.2:6.8, was used.

(Evaluation of Polished Product)

[Polishing Rate of Blanket Wafer]

With respect to the substrate to be polished, polished and washed under the above conditions, the polishing rate of each of the films to be polished (silicon oxide film and polysilicon film) (the polishing rate of the silicon oxide film: $SiO_2RR$, and the polishing rate of the polysilicon film: p-SiRR) was determined by the following expression. Herein, the difference in thickness of each of the films to be polished, between before and after polishing, was determined using a light interference-type film thickness apparatus (trade name: F80 manufactured by Filmetrics Japan Inc.).

(Polishing rate: RR)=(Difference in thickness of each
film to be polished, between before and after
polishing (nm))/(polishing time (min))

[Polishing Scratches]

The substrate to be polished (blanket wafer) polished and washed under the above conditions was immersed in 0.5 mass % hydrogen fluoride aqueous solution for 15 seconds, and then washed with water for 60 seconds. Subsequently, the surface of the film to be polished was washed by a PVA brush for 1 minute with water being supplied, and then dried. Complus manufactured by APPLIED MATERIALS Inc. was used to detect a defect of 0.2 µm or more on the film to be polished. Furthermore, when defect detection coordinates obtained by Complus and SEM Vision manufactured by APPLIED MATERIALS Inc. were used to observe the surface of the film to be polished, the number of polishing scratches of 0.2 μm or more on the surface of the film to be polished was found to be about 0 to 3 (scratches/wafer) in all of Examples 1 to 10 and Comparative Examples 1 to 17, and the occurrence of polishing scratches was sufficiently suppressed.

[Patterned Wafer Evaluation]

With respect to each of the regions having a different convex pattern density, the remaining thickness of the polysilicon film on the convex region of the patterned wafer polished and washed under the above conditions was measured. In order to evaluate the dependence of the thickness of the polysilicon film on the convex pattern density, the difference between the maximum and the minimum of the thickness of the polysilicon film, obtained by measuring at each of the regions having a different convex pattern density, was determined by the following expression. Herein, the thicknesses of each of the films to be polished, between before and after polishing, were determined using a light interference-type film thickness apparatus (trade name: Nanospec AFT-5100 manufactured by Nanometrics Incorporated).

Difference in thickness of polysilicon film (nm)= (maximum thickness of polysilicon film (nm))− (minimum thickness of polysilicon film (nm))

Herein, with respect to a region in which the silicon oxide film was not completely removed and the polysilicon film was not exposed, the thickness of the silicon oxide film remaining in such region was measured (In Tables, each numeral marked with * represents the remaining thickness of the silicon oxide film). In such a case, the difference in thickness of the polysilicon film was not measured.

The respective measurement results obtained in Examples 1 to 10 and Comparative Examples 1 to 17 are shown in Table 1 to Table 5.

TABLE 1

| Components blended | Items | \multicolumn{8}{c}{Examples} |
|---|---|---|---|---|---|---|---|---|---|
| | | 1 | | 2 | 3 | | 4 | 5 | 6 |
| Abrasive grain | Type | \multicolumn{8}{c}{Cerium hydroxide} |
| | Content (mass %) | \multicolumn{8}{c}{0.05} |
| First additive (aromatic polyoxyalkylene compound) | Type | \multicolumn{8}{c}{Polyoxyethylene styrenated phenyl ether} |
| | Weight average molecular weight | \multicolumn{8}{c}{4500} |
| | Content (mass %) | 0.2 | | 0.5 | 1.0 | | | 0.5 | |
| Second additive (cationic polymer) | Type | \multicolumn{8}{c}{Diallyldimethylammonium chloride-acrylamide copolymer} |
| | Weight average molecular weight | \multicolumn{8}{c}{200000} |
| | Content (mass %) | 0.003 | | 0.0015 | | | 0.003 | | |
| pH adjuster | Type | \multicolumn{8}{c}{Imidazole} |
| | Content (mass %) | | | 0.008 | | | 0.016 | 0.0057 | 0.014 |
| pH stabilizer | Type | \multicolumn{8}{c}{Acetic acid} |
| | Content (mass %) | | | 0.005 | | | 0.01 | 0.005 | |
| Physical properties of polishing liquid | pH | 5.8 | | 5.8 | 5.8 | | 6.3 | 5.0 | 6.7 |
| | Average particle diameter of abrasive grain (nm) | 25 | | 25 | 25 | | 25 | 25 | 25 |
| Polishing rate (nm/min) | SiO₂RR | 320 | | 222 | 300 | | 273 | 301 | 228 |
| | p-SiRR | 0.2 | | 0.1 | 0.1 | | 0.1 | 0.2 | 0.1 |
| Polishing rate ratio | SiO₂RR/p-SiRR | 1600 | | 2220 | 3000 | | 2730 | 1505 | 2280 |
| Patterned wafer evaluation (pitch of 100 μm) | Polishing time (sec) | 25 | 50 | 33 | 66 | 25 | 50 23 | 46 22 | 44 21 | 42 |
| | 20% density p-Si film thickness (nm) | 145 | 144 | 146 | 142 | 146 | 143 144 | 139 148 | 146 148 | 147 |
| | 30% density p-Si film thickness (nm) | 147 | 146 | 146 | 144 | 146 | 145 145 | 140 149 | 147 148 | 148 |
| | 50% density p-Si film thickness (nm) | 149 | 148 | 147 | 146 | 147 | 146 148 | 146 149 | 148 149 | 149 |
| | 80% density p-Si film thickness (nm) | 150 | 150 | 148 | 147 | 148 | 148 148 | 148 150 | 149 150 | 149 |
| | Difference in p-Si film thickness (nm) | 5 | 6 | 2 | 5 | 2 | 5 4 | 9 2 | 3 2 | 2 |

TABLE 2

| Components blended | Items | Examples | | | |
|---|---|---|---|---|---|
| | | 7 | 8 | 9 | 10 |
| Abrasive grain | Type | \multicolumn{4}{c}{Cerium hydroxide} |
| | Content (mass %) | \multicolumn{4}{c}{0.05} |
| First additive (aromatic polyoxyalkylene compound) | Type | \multicolumn{3}{c}{Polyoxyethylene styrenated phenyl ether} | Polyoxyethylene alkylphenyl ether |
| | Weight average molecular weight | \multicolumn{3}{c}{4500} | 3000 |
| | Content (mass %) | \multicolumn{4}{c}{0.5} |

TABLE 2-continued

| Components blended | Items | Examples 7 | | Examples 8 | | Examples 9 | | Examples 10 | |
|---|---|---|---|---|---|---|---|---|---|
| Second additive (cationic polymer) | Type | Polyallylamine | | Diallyldimethylammonium chloride polymer | | Diallyldimethylammonium chloride-acrylamide copolymer | | | |
| | Weight average molecular weight | 1600 | | 200000 | | 10000 | | 200000 | |
| | Content (mass %) | 0.001 | | | | 0.003 | | | |
| pH adjuster | Type | | | | | Imidazole | | | |
| | Content (mass %) | | | | | 0.008 | | | |
| pH stabilizer | Type | | | | | Acetic acid | | | |
| | Content (mass %) | | | | | 0.005 | | | |
| Physical properties of polishing liquid | pH | 6.7 | | 6.1 | | 6.3 | | 6.0 | |
| | Average particle diameter of abrasive grain (nm) | 25 | | 25 | | 25 | | 25 | |
| Polishing rate (nm/min) | SiO₂RR | 230 | | 285 | | 299 | | 294 | |
| | p-SiRR | 0.1 | | 0.2 | | 0.2 | | 0.2 | |
| Polishing rate ratio | SiO₂RR/p-SiRR | 2300 | | 1425 | | 1495 | | 1470 | |
| Patterned wafer evaluation (pitch of 100 μm) | Polishing time (sec) | 30 | 60 | 25 | 50 | 24 | 48 | 25 | 50 |
| | 20% density p-Si film thickness (nm) | 148 | 145 | 148 | 145 | 147 | 141 | 146 | 140 |
| | 30% density p-Si film thickness (nm) | 148 | 146 | 148 | 146 | 148 | 144 | 147 | 142 |
| | 50% density p-Si film thickness (nm) | 149 | 148 | 149 | 148 | 149 | 148 | 149 | 147 |
| | 80% density p-Si film thickness (nm) | 150 | 149 | 150 | 149 | 150 | 150 | 150 | 149 |
| | Difference in p-Si film thickness (nm) | 2 | 4 | 2 | 4 | 3 | 9 | 4 | 9 |

TABLE 3

| Components blended | Items | Comparative Examples 1 | Comparative Examples 2 | Comparative Examples 3 | Comparative Examples 4 | Comparative Examples 5 | Comparative Examples 6 |
|---|---|---|---|---|---|---|---|
| Abrasive grain | Type | Cerium hydroxide | | | | | |
| | Content (mass %) | 0.05 | | | | | |
| First additive | Type | — | Polyethylene glycol | Polyoxyethylene styrenated phenyl ether | | Polyvinyl alcohol | |
| | Weight average molecular weight | — | 600 | 4500 | | 14000 | |
| | Content (mass %) | — | 0.5 | 0.5 | | 0.5 | |
| Second additive | Type | — | — | — | — | Polyallylamine | |
| | Weight average molecular weight | — | — | — | — | 1600 | 8000 |
| | Content (mass %) | — | — | — | — | 0.0001 | 0.0008 |
| pH adjuster | Type | | | | Imidazole | | |
| | Content (mass %) | 0.01 | | | 0.008 | | |
| pH stabilizer | Type | — | | | Acetic acid | | |
| | Content (mass %) | — | | | 0.005 | | |
| Physical properties of polishing liquid | pH | 5.9 | 6.2 | 6.8 | 5.8 | 5.9 | 5.9 |
| | Average particle diameter of abrasive grain (nm) | 25 | 25 | 25 | 41 | 41 | 41 |
| Polishing rate (nm/min) | SiO₂RR | 163 | 94 | 85 | 180 | 192 | 205 |
| | p-SiRR | 62 | 4.0 | 2.9 | 12 | 1.0 | 0.9 |
| Polishing rate ratio | SiO₂RR/p-SiRR | 3 | 24 | 29 | 15 | 192 | 228 |
| Patterned wafer evaluation (pitch of 100 μm) | Polishing time (sec) | — | 30 | 60 | 60 | 30 | 60 | 30 | 21 | 42 |
| | 20% density p-Si film thickness (nm) | — | 145 | 127 | 148 | 141 | 111 | 150 | 139 | 95 |
| | 30% density p-Si film thickness (nm) | — | 146 | 131 | 150 | 144 | 121 | 150 | 144 | 122 |
| | 50% density p-Si film thickness (nm) | — | 148 | 135 | 40* | 148 | 132 | 52* | 150 | 137 |

TABLE 3-continued

| Components blended | Items | Comparative Examples | | | | | | | | |
|---|---|---|---|---|---|---|---|---|---|---|
| | | 1 | 2 | | 3 | 4 | | 5 | 6 | |
| | 80% density p-Si film thickness (nm) | — | 150 | 141 | 62* | 150 | 142 | 154* | 150 | 149 |
| | Difference in p-Si film thickness (nm) | — | 5 | 14 | — | 9 | 31 | — | 11 | 54 |

*represents the amount of the remaining silicon oxide film (nm).

TABLE 4

| Components blended | Items | Comparative Examples | | | | | | | | |
|---|---|---|---|---|---|---|---|---|---|---|
| | | 7 | 8 | | 9 | 10 | | 11 | | |
| Abrasive grain | Type | Cerium hydroxide | | | | | | | | |
| | Content (mass %) | 0.05 | | | | | | | | |
| First additive | Type | Polyethylene glycol | | | | | | | | |
| | Weight average molecular weight | 600 | | | | | | | | |
| | Content (mass %) | 0.5 | | 1.0 | | | 0.5 | | | |
| Second additive | Type | Diallyldimethylammonium chloride-acrylamide copolymer | | | | | | | | |
| | Weight average molecular weight | 200000 | | | | | | | | |
| | Content (mass %) | 0.0015 | | | | 0.003 | | | | |
| pH adjuster | Type | Imidazole | | | | | | | | |
| | Content (mass %) | 0.008 | | 0.016 | 0.0057 | 0.008 | | 0.014 | | |
| pH stabilizer | Type | Acetic acid | | | | | | | | |
| | Content (mass %) | 0.005 | | 0.01 | | 0.005 | | | | |
| Physical properties of polishing liquid | pH | 6.0 | | 6.3 | 5.0 | 5.8 | | 6.7 | | |
| | Average particle diameter of abrasive grain (nm) | 25 | | 25 | 25 | 25 | | 25 | | |
| Polishing rate (nn/min) | SiO₂RR | 280 | | 363 | 192 | 363 | | 233 | | |
| | p-SiRR | 0.4 | | 0.2 | 0.2 | 0.1 | | 0.3 | | |
| Polishing rate ratio | SiO₂RR/p-SiRR | 700 | | 1815 | 960 | 3630 | | 777 | | |
| Patterned wafer evaluation (pitch of 100 μm) | Polishing time (sec) | 27 | 54 | 22 | 44 28 | 56 | 17 | 34 | 30 | 60 |
| | 20% density p-Si film thickness (nm) | 134 | 113 | 130 | 125 129 | 106 | 122 | 116 | 139 | 135 |
| | 30% density p-Si film thickness (nm) | 137 | 119 | 144 | 141 143 | 127 | 138 | 136 | 146 | 145 |
| | 50% density p-Si film thickness (nm) | 145 | 130 | 147 | 146 147 | 146 | 147 | 146 | 149 | 148 |
| | 80% density p-Si film thickness (nm) | 147 | 146 | 148 | 146 148 | 147 | 147 | 146 | 149 | 148 |
| | Difference in p-Si film thickness (nm) | 13 | 33 | 18 | 21 19 | 41 | 25 | 30 | 10 | 13 |

TABLE 5

| Components blended | Items | Comparative Examples | | | | | |
|---|---|---|---|---|---|---|---|
| | | 12 | 13 | 14 | 15 | 16 | 17 |
| Abrasive grain | Type | Cerium hydroxide | | | | | |
| | Content (mass %) | 0.05 | | | | | |
| First additive | Type | Polyethylene glycol | Polyoxyethylene styrenated phenyl ether | Polyoxyethylene lauryl ether | EO adduct of acetylene diol | Polyglycerol | Polyoxyethylene polyglyceryl ether |
| | Weight average molecular weight | 4000 | 700 | — | — | 750 | 2000 |
| | Content (mass %) | | | 0.5 | | | |

TABLE 5-continued

| Components blended | Items | Comparative Examples 12 | | 13 | | 14 | | 15 | | 16 | | 17 | |
|---|---|---|---|---|---|---|---|---|---|---|---|---|---|
| Second additive | Type | Diailyldimethylammonium chloride-acrylamide copolymer | | | | | | | | Polyallylamine | | | |
| | Weight average molecular weight | 200000 | | | | | | | | 1600 | | | |
| | Content (mass %) | 0.003 | | | | | | | | 0.002 | | 0.001 | |
| pH adjuster | Type | | | | | Imidazole | | | | | | | |
| | Content (mass %) | | | | | 0.008 | | | | | | | |
| pH stabilizer | Type | | | | | Acetic acid | | | | | | | |
| | Content (mass %) | | | | | 0.005 | | | | | | | |
| Physical properties of polishing liquid | pH | 6.0 | | 6.1 | | 6.0 | | 6.1 | | 6.7 | | 6.5 | |
| | Average particle diameter of abrasive grain (nm) | 25 | | 25 | | 25 | | 25 | | 25 | | 25 | |
| Polishing rate (nm/min) | $SiO_2$RR | 299 | | 291 | | 327 | | 320 | | 426 | | 286 | |
| | p-SiRR | 0.2 | | 0.1 | | 0.1 | | 0.5 | | 0.1 | | 1.4 | |
| Polishing rate ratio | $SiO_2$RR/p-SiRR | 1495 | | 2910 | | 3270 | | 640 | | 4260 | | 204 | |
| Patterned wafer evaluation (pitch of 100 μm) | Polishing time (sec) | 21 | 42 | 23 | 46 | 21 | 42 | 23 | 46 | 15 | 30 | 30 | 60 |
| | 20% density p-Si film thickness (nm) | 142 | 135 | 144 | 129 | 142 | 128 | 121 | 100 | 125 | 109 | 128 | 105 |
| | 30% density p-Si film thickness (nm) | 147 | 145 | 146 | 136 | 146 | 136 | 131 | 119 | 135 | 118 | 133 | 115 |
| | 50% density p-Si film thickness (nm) | 149 | 149 | 149 | 144 | 149 | 148 | 137 | 135 | 149 | 148 | 147 | 146 |
| | 80% density p-Si film thickness (nm) | 150 | 149 | 149 | 149 | 150 | 149 | 137 | 136 | 150 | 150 | 150 | 150 |
| | Difference in p-Si film thickness (nm) | 8 | 14 | 5 | 20 | 8 | 21 | 15 | 36 | 25 | 41 | 22 | 45 |

Herein, polyoxyethylene styrenated phenyl ether [Noigen EA-207D produced by Dai-Ichi Kogyo Seiyaku Co., Ltd., weight average molecular weight: 4500] is the following compound corresponding to the above formula (I) and formula (III).

$R^{11}$: styrenated phenyl group
$R^{12}$, $R^{31}$: ethylene group
m1, m3: 100
m2: 1 to 3

In addition, polyoxyethylene alkylphenyl ether [Emulsit 49 produced by Dai-Ichi Kogyo Seiyaku Co., Ltd., weight average molecular weight: 3000] is the following compound corresponding to the above formula (I) and formula (IV).

$R^{11}$: alkylphenyl group
$R^{12}$, $R^{42}$: ethylene group
$R^{41}$: nonyl group
m1, m4: 70

Hereinafter, the results shown in Table 1 to Table 5 are described in detail.

In Examples 1 to 10, the results obtained in unpatterned wafer (blanket wafer) evaluation were as follows: the polishing rate of silicon oxide was good, the polishing rate of polysilicon was suppressed, and the polishing rate ratio of silicon oxide to polysilicon was extremely high.

In Example 1, the results in patterned wafer evaluation were as follows: the difference in thickness of the polysilicon film was 5 nm at the point of time where the polysilicon film was exposed, and was 6 nm even if polishing was made for additional 25 seconds, and polishing of the polysilicon film was suppressed without depending on the convex pattern density rather than the cases of Comparative Examples.

In Example 2, the results in patterned wafer evaluation were as follows: the difference in thickness of the polysilicon film was 2 nm at the point of time where the polysilicon film was exposed, and was 5 nm even if polishing was made for additional 33 seconds, and polishing of the polysilicon film was suppressed without depending on the convex pattern density rather than the cases of Comparative Examples.

In Example 3, the results in patterned wafer evaluation were as follows: the difference in thickness of the polysilicon film was 2 nm at the point of time where the polysilicon film was exposed, and was 5 nm even if polishing was made for additional 25 seconds, and polishing of the polysilicon film was suppressed without depending on the convex pattern density rather than the cases of Comparative Examples.

In Example 4, the results in patterned wafer evaluation were as follows: the difference in thickness of the polysilicon film was 4 nm at the point of time where the polysilicon film was exposed, and was 9 nm even if polishing was made for additional 23 seconds, and polishing of the polysilicon film was suppressed without depending on the convex pattern density rather than the cases of Comparative Examples.

In Example 5, the results in patterned wafer evaluation were as follows: the difference in thickness of the polysilicon film was 2 nm at the point of time where the polysilicon film was exposed, and was 3 nm even if polishing was made for additional 22 seconds, and polishing of the polysilicon film was suppressed without depending on the convex pattern density rather than the cases of Comparative Examples.

In Example 6, the results in patterned wafer evaluation were as follows: the difference in thickness of the polysilicon film was 2 nm at the point of time where the polysilicon film was exposed, and was 2 nm even if polishing was made for additional 21 seconds, and polishing of the polysilicon film was suppressed without depending on the convex pattern density rather than the cases of Comparative Examples.

In Example 7, the results in patterned wafer evaluation were as follows: the difference in thickness of the polysilicon film was 2 nm at the point of time where the polysilicon film was exposed, and was 4 nm even if polishing was made for additional 30 seconds, and polishing of the polysilicon film was suppressed without depending on the convex pattern density rather than the cases of Comparative Examples.

In Example 8, the results in patterned wafer evaluation were as follows: the difference in thickness of the polysilicon film was 2 nm at the point of time where the polysilicon film was exposed, and was 4 nm even if polishing was made for additional 25 seconds, and polishing of the polysilicon film was suppressed without depending on the convex pattern density rather than the cases of Comparative Examples.

In Example 9, the results in patterned wafer evaluation were as follows: the difference in thickness of the polysilicon film was 3 nm at the point of time where the polysilicon film was exposed, and was 9 nm even if polishing was made for additional 24 seconds, and polishing of the polysilicon film was suppressed without depending on the convex pattern density rather than the cases of Comparative Examples.

In Example 10, the results in patterned wafer evaluation were as follows: the difference in thickness of the polysilicon film was 4 nm at the point of time where the polysilicon film was exposed, and was 9 nm even if polishing was made for additional 25 seconds, and polishing of the polysilicon film was suppressed without depending on the convex pattern density rather than the cases of Comparative Examples.

In Comparative Example 1, the $SiO_2RR$ was 163 nm/min, the p-SiRR was 62 nm/min, and the polishing rate ratio was 3.

In Comparative Example 2, the difference in thickness of the polysilicon film was 5 nm at the point of time where the polysilicon film was exposed, and was 14 nm at the point of time where polishing was made for additional 30 seconds, in patterned wafer evaluation.

In Comparative Example 3, the silicon oxide film of the convex region could not be removed within 60 seconds in regions with pattern densities of 50% and 80% in patterned wafer evaluation.

In Comparative Example 4, the difference in thickness of the polysilicon film was 9 nm at the point of time where the polysilicon film was exposed, and was 31 nm at the point of time where polishing was made for additional 30 seconds, in patterned wafer evaluation.

In Comparative Example 5, the silicon oxide film of the convex region could not be removed within 30 seconds in regions with pattern densities of 50% and 80% in patterned wafer evaluation.

In Comparative Example 6, the difference in thickness of the polysilicon film was 11 nm at the point of time where the polysilicon film was exposed, and was 54 nm at the point of time where polishing was made for additional 21 seconds, in patterned wafer evaluation.

In Comparative Example 7, the difference in thickness of the polysilicon film was 13 nm at the point of time where the polysilicon film was exposed, and was 33 nm at the point of time where polishing was made for additional 27 seconds, in patterned wafer evaluation.

In Comparative Example 8, the difference in thickness of the polysilicon film was 18 nm at the point of time where the polysilicon film was exposed, and was 21 nm at the point of time where polishing was made for additional 22 seconds, in patterned wafer evaluation.

In Comparative Example 9, the difference in thickness of the polysilicon film was 19 nm at the point of time where the polysilicon film was exposed, and was 41 nm at the point of time where polishing was made for additional 28 seconds, in patterned wafer evaluation.

In Comparative Example 10, the difference in thickness of the polysilicon film was 25 nm at the point of time where the polysilicon film was exposed, and was 30 nm at the point of time where polishing was made for additional 17 seconds, in patterned wafer evaluation.

In Comparative Example 11, the difference in thickness of the polysilicon film was 10 nm at the point of time where the polysilicon film was exposed, and was 13 nm at the point of time where polishing was made for additional 30 seconds, in patterned wafer evaluation.

In Comparative Example 12, the difference in thickness of the polysilicon film was 8 nm at the point of time where the polysilicon film was exposed, and was 14 nm at the point of time where polishing was made for additional 21 seconds, in patterned wafer evaluation.

In Comparative Example 13, the difference in thickness of the polysilicon film was 5 nm at the point of time where the polysilicon film was exposed, and was 20 nm at the point of time where polishing was made for additional 23 seconds, in patterned wafer evaluation.

In Comparative Example 14, the difference in thickness of the polysilicon film was 8 nm at the point of time where the polysilicon film was exposed, and was 21 nm at the point of time where polishing was made for additional 21 seconds, in patterned wafer evaluation.

In Comparative Example 15, the difference in thickness of the polysilicon film was 16 nm at the point of time where the polysilicon film was exposed, and was 36 nm at the point of time where polishing was made for additional 23 seconds, in patterned wafer evaluation.

In Comparative Example 16, the difference in thickness of the polysilicon film was 25 nm at the point of time where the polysilicon film was exposed, and was 41 nm at the point of time where polishing was made for additional 15 seconds, in patterned wafer evaluation.

In Comparative Example 17, the difference in thickness of the polysilicon film was 22 nm at the point of time where the polysilicon film was exposed, and was 45 nm at the point of time where polishing was made for additional 30 seconds, in patterned wafer evaluation.

INDUSTRIAL APPLICABILITY

According to the present invention, it is possible to provide a polishing agent, a polishing agent set and a method for polishing a base, which enable the polishing selectivity of the insulating material to the stopper material to be enhanced, and enable the polishing rate of the stopper material to be suppressed without depending on the convex pattern density even in the case where over-polishing is performed in polishing of the insulating material by use of the stopper. In addition, according to the present invention, it is possible to provide a polishing agent, a polishing agent set and a method for polishing a base, which enable the polishing selectivity of the insulating material to polysilicon to be enhanced, and enable the polishing rate of polysilicon to be suppressed without depending on the convex pattern density even in the case where over-polishing is performed in polishing of the insulating material by use of polysilicon as the stopper material. Furthermore, according to the present invention, in a CMP technique for flattening a shallow trench isolation insulating material, a pre-metal insulating material, an interlayer insulating material, or the like, it is also possible to polish the insulating material with decreased polishing scratches while enhancing the polishing selectivity of the insulating material to the stopper material without depending on the convex pattern density in polishing of the insulating material by use of the stopper.

REFERENCE SIGNS LIST

1 . . . Silicon substrate, 2 . . . Polysilicon film, 3 . . . Silicon oxide film.

The invention claimed is:

1. A polishing agent, containing:
   a liquid medium;
   an abrasive grain including a hydroxide of a tetravalent metal element;
   a polymer compound having an aromatic ring and a polyoxyalkylene chain; and
   a cationic polymer, wherein
   a weight average molecular weight of the polymer compound is 1000 or more.

2. The polishing agent according to claim 1, wherein the tetravalent metal element includes at least one selected from the group consisting of a rare earth element and zirconium.

3. The polishing agent according to claim 1, wherein a content of the polymer compound is 0.01 mass % or more based on a total mass of the polishing agent.

4. The polishing agent according to claim 1, wherein the polymer compound includes a compound represented by the following general formula (I):

$$R^{11}-O-(R^{12}-O)_{m1}-H \qquad (I),$$

wherein, in formula (I), $R^{11}$ represents an aryl group which may have a substituent, $R^{12}$ represents an alkylene group having 1 to 5 carbon atoms, which may have a substituent, and m1 represents an integer of 15 or more.

5. The polishing agent according to claim 1, which is used for polishing a surface to be polished including silicon oxide.

6. A polishing agent set, wherein constituents of the polishing agent according to claim 1 are stored with being separated to a first liquid and a second liquid, the first liquid contains the abrasive grain and a liquid medium, and the second liquid contains the polymer compound, the cationic polymer and a liquid medium.

7. A method for polishing a base, comprising a step of polishing a surface to be polished of a base by use of the polishing agent according to claim 1.

8. A method for polishing a base, comprising a step of polishing a surface to be polished of a base by use of a polishing agent obtained by mixing the first liquid and the second liquid of the polishing agent set according to claim 6.

* * * * *